US012287356B2

(12) United States Patent
Komiya et al.

(10) Patent No.: US 12,287,356 B2
(45) Date of Patent: Apr. 29, 2025

(54) VOLTAGE HOLD CIRCUIT, VOLTAGE MONITORING CIRCUIT, AND SEMICONDUCTOR INTEGRATED CIRCUIT

(71) Applicant: Socionext Inc., Kanagawa (JP)

(72) Inventors: Kengo Komiya, Yokohama (JP); Akimitsu Tajima, Yokohama (JP); Takeshi Kimura, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 214 days.

(21) Appl. No.: 17/746,467

(22) Filed: May 17, 2022

(65) Prior Publication Data

US 2022/0276286 A1 Sep. 1, 2022

Related U.S. Application Data

(63) Continuation of application No. PCT/JP2019/046716, filed on Nov. 29, 2019.

(51) Int. Cl.
*G01R 19/04* (2006.01)
*G01R 19/25* (2006.01)
*G05F 1/46* (2006.01)

(52) U.S. Cl.
CPC ......... *G01R 19/04* (2013.01); *G01R 19/2503* (2013.01); *G05F 1/468* (2013.01)

(58) Field of Classification Search
CPC ...... G01R 19/04; G01R 19/2503; G05F 1/468
See application file for complete search history.

(56) References Cited

U.S. PATENT DOCUMENTS

| 7,385,797 | B1 | 6/2008 | Garnett |
| 8,063,667 | B2 * | 11/2011 | Tomita ............ G11B 7/1263 |
| | | | 327/91 |
| 8,330,513 | B2 * | 12/2012 | Lai .................. H03L 7/104 |
| | | | 327/158 |
| 2012/0119789 | A1 | 5/2012 | Romero et al. |
| 2016/0118970 | A1 | 4/2016 | Kim et al. |
| 2018/0059151 | A1 | 3/2018 | Trescases et al. |

FOREIGN PATENT DOCUMENTS

| JP | H09-046192 A | 2/1997 |
| JP | H11-242059 A | 9/1999 |
| JP | H11-311644 A | 11/1999 |

(Continued)

OTHER PUBLICATIONS

Japanese Office Action dated Sep. 19, 2023 issued in the corresponding Japanese Patent Application No. 2021-561094, with English translation.

(Continued)

*Primary Examiner* — Reena Aurora
(74) *Attorney, Agent, or Firm* — Rimon P.C.

(57) ABSTRACT

The voltage hold circuit is a voltage hold circuit configured to operate every processing cycle, the processing cycle including a hold period and a reset period following the hold period, and hold a voltage value for an input voltage signal, the voltage hold circuit including: a first hold circuit configured to operate to hold a minimum voltage value for the input voltage signal in the hold period every the processing cycle; and a second hold circuit configured to operate to hold a maximum voltage value for the input voltage signal in the reset period every the processing cycle.

21 Claims, 18 Drawing Sheets

(56) References Cited

FOREIGN PATENT DOCUMENTS

| | | | |
|---|---|---|---|
| JP | 2003-215173 | A | 7/2003 |
| JP | 2010-085328 | A | 4/2010 |
| JP | 2010-096696 | A | 4/2010 |
| JP | 2010-226266 | A | 10/2010 |
| JP | 2010-244610 | A | 10/2010 |
| JP | 2011-009938 | A | 1/2011 |

OTHER PUBLICATIONS

Office Action of Japanese Patent Application 2021-561094 dated Jan. 23, 2024, w/English MT.
International Search Report (ISR) and Written Opinion of the International Searching Authority issued in International Patent Application No. PCT/JP2019/046716, dated Feb. 18, 2020; with partial English translation.
Notice of Reasons for Refusal dated May 21, 2024 issued in the corresponding Japanese Patent Application No. 2021-561094, with English machine translation.
First Office Action received in corresponding Chinese Patent Application No. 201980102475.2, dated Dec. 13, 2024.

\* cited by examiner

F I G. 13
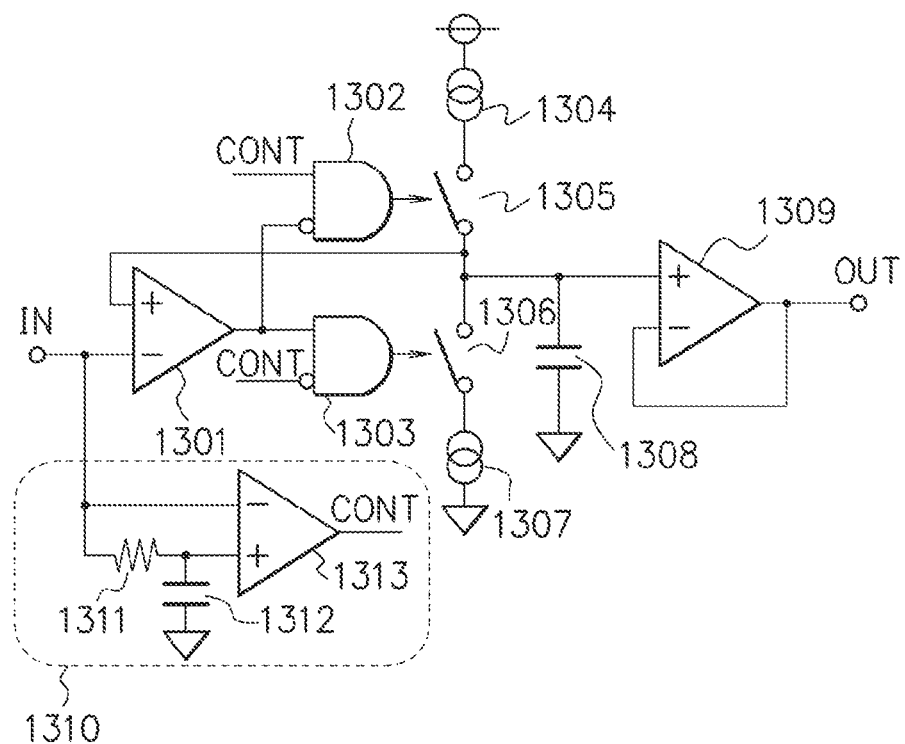
F I G. 14
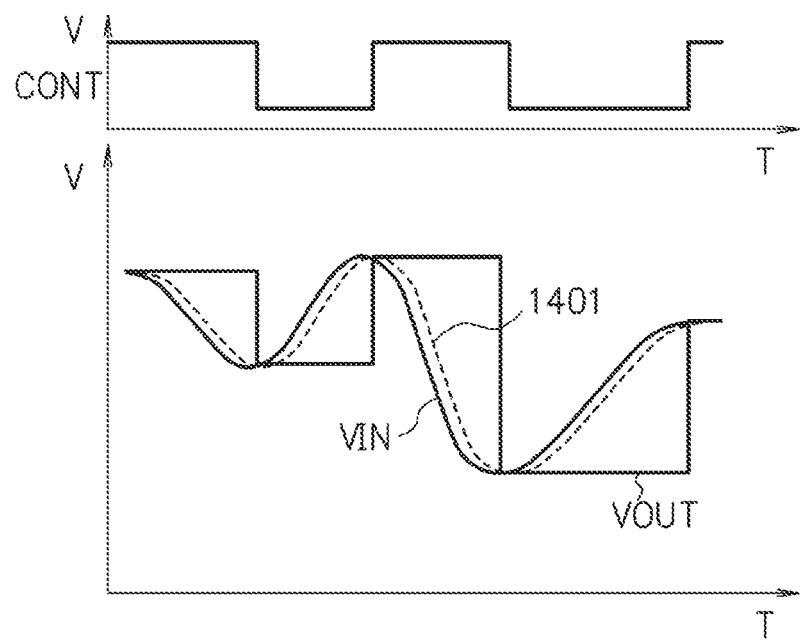

F I G. 16
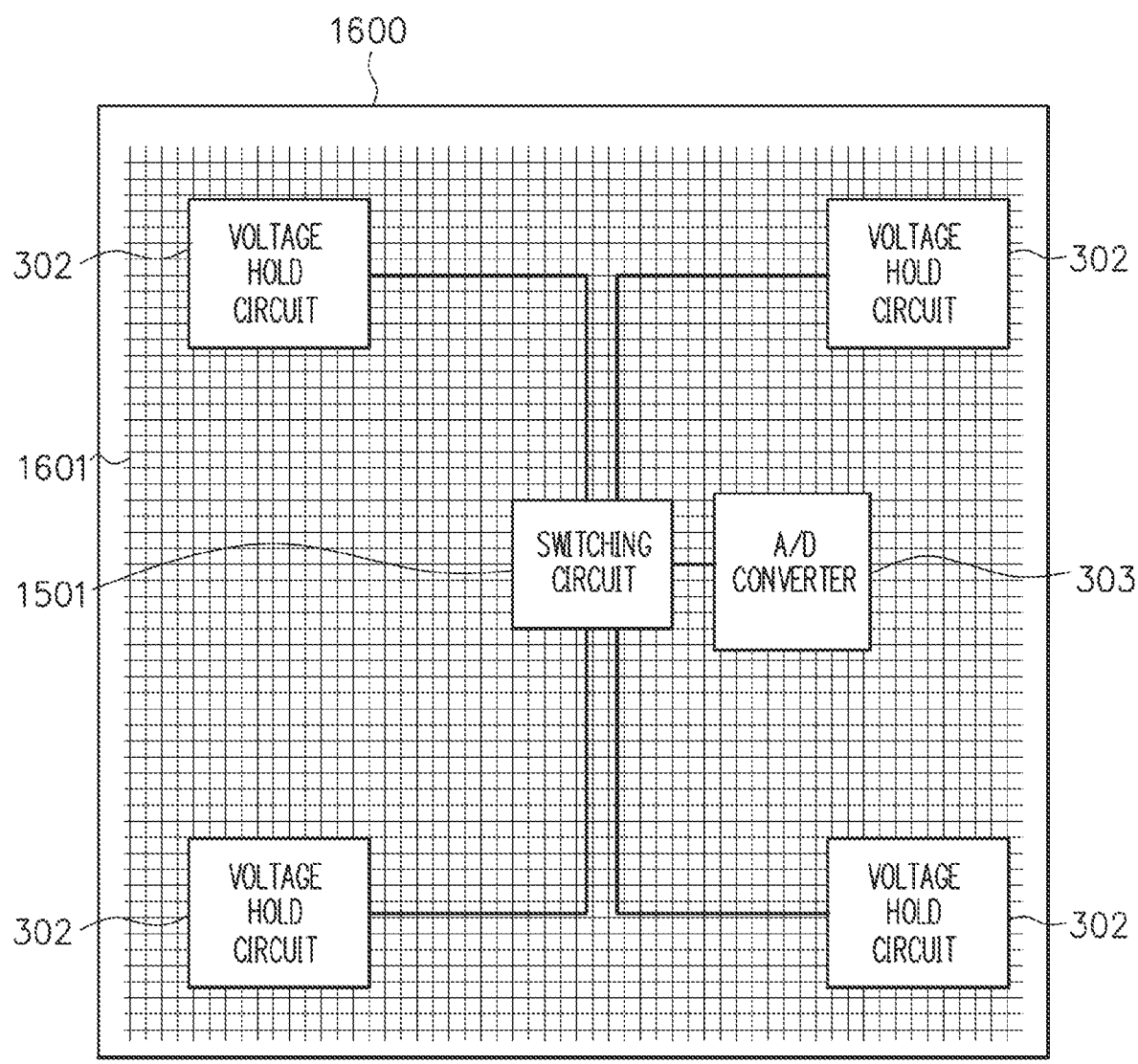

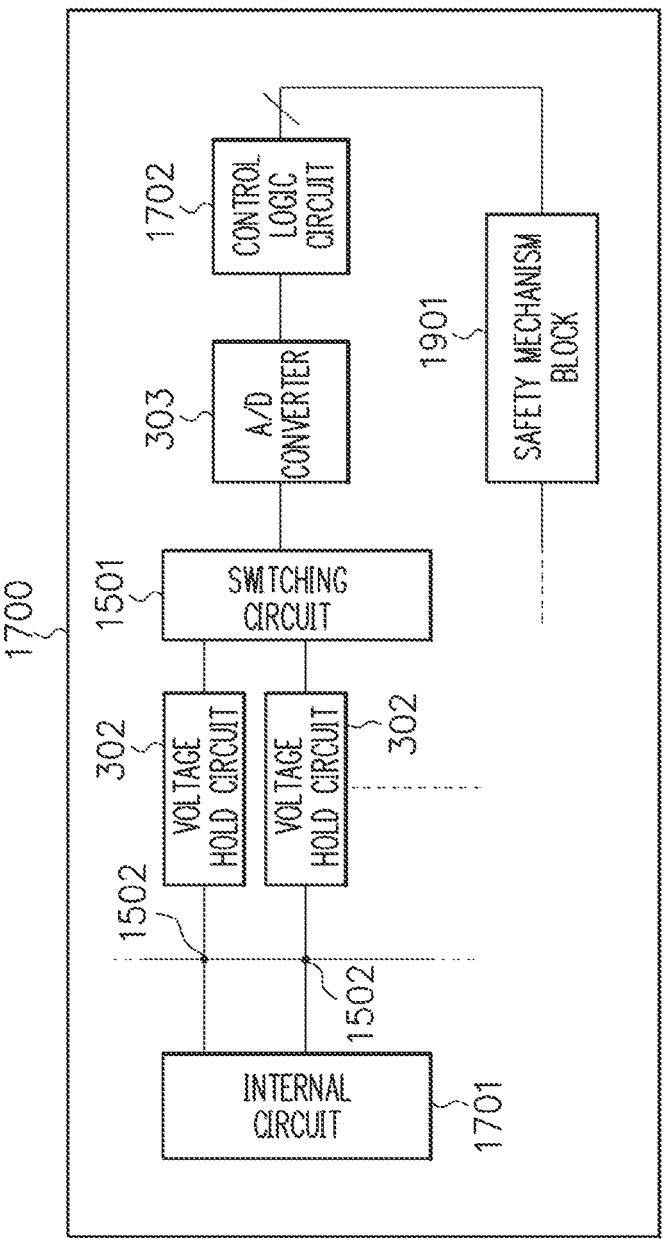
F I G. 19

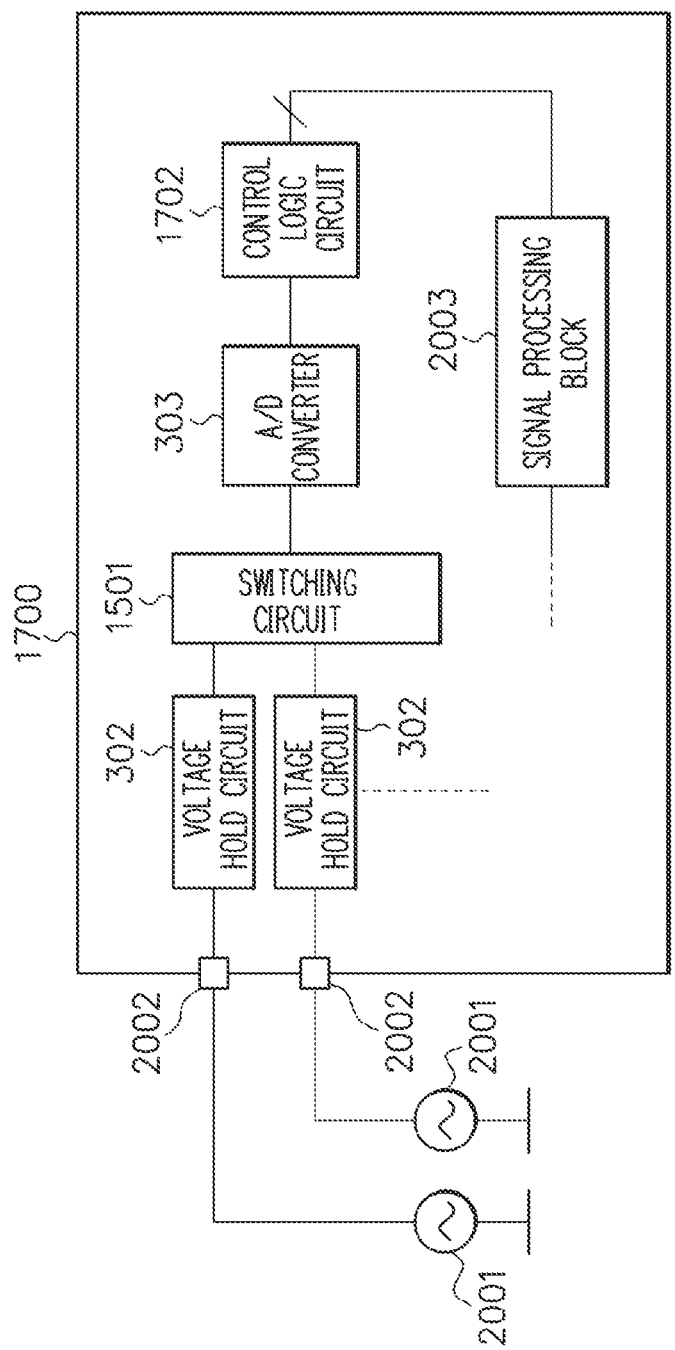
F I G. 20

F I G. 24
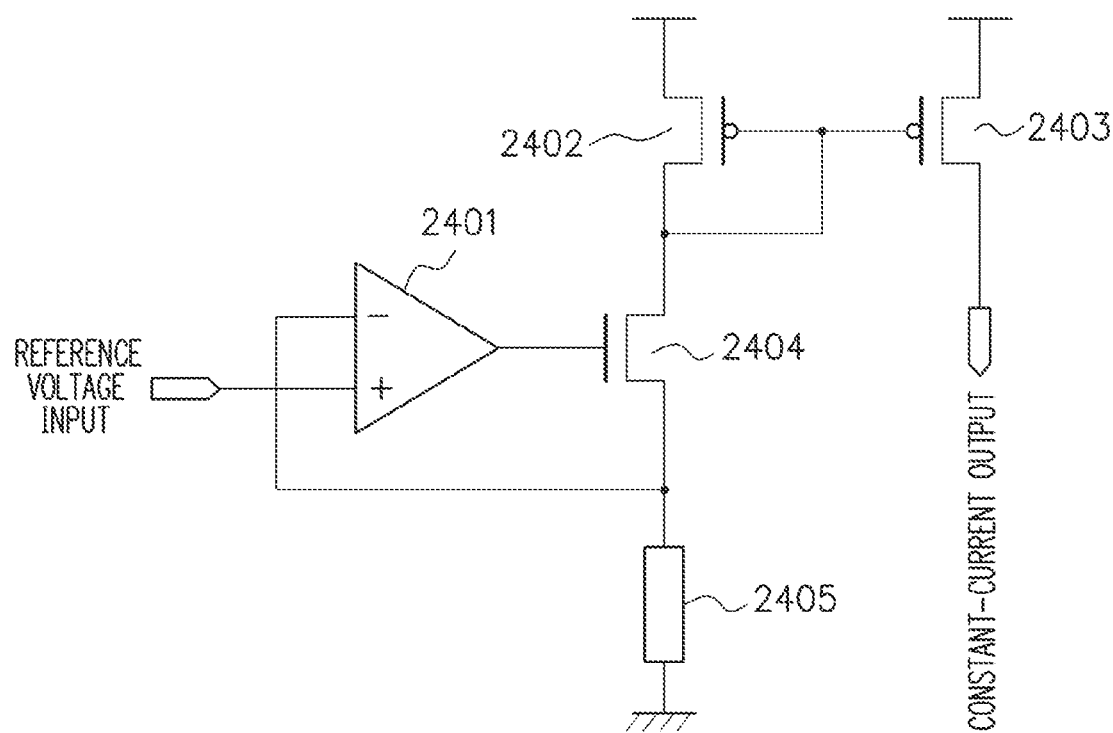
F I G. 25
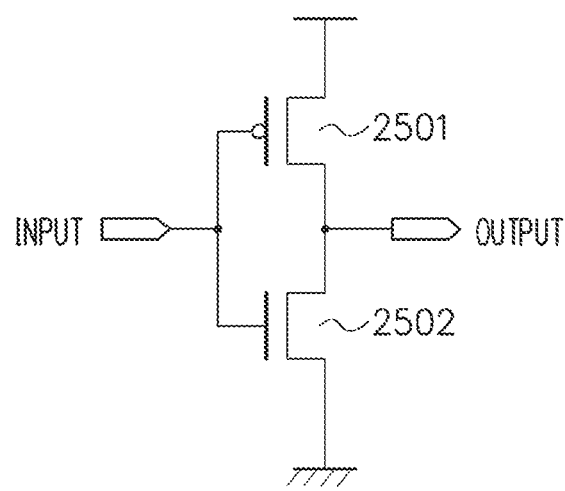

1

VOLTAGE HOLD CIRCUIT, VOLTAGE MONITORING CIRCUIT, AND SEMICONDUCTOR INTEGRATED CIRCUIT

CROSS-REFERENCE TO RELATED APPLICATION

This application is a continuation application of International Application PCT/JP2019/046716 filed on Nov. 29, 2019, and designated the U.S., the entire contents of which are incorporated herein by reference.

FIELD

The embodiments discussed herein are directed to a voltage hold circuit, a voltage monitoring circuit, and a semiconductor integrated circuit.

BACKGROUND

Patent Document 1 discloses a peak hold circuit including: a voltage holding element that holds an applied voltage; a charge switch element that controls a charge state of the voltage holding element; a bias circuit that adds a bias voltage to an input signal; and a comparison circuit. The comparison circuit compares the voltage of the voltage holding element with the input signal to which the bias voltage is added, and controls the charge switch element so that the voltage holding element is brought into a charge state when the voltage of the voltage holding element is low. The peak hold circuit regards a hold voltage of the voltage holding element as an output.

Patent Document 2 discloses a peak hold circuit with droop correction that includes: a peak hold circuit provided with a hold capacitor that holds a peak voltage of an input signal; and a droop correction circuit that generates a voltage with a polarity opposite to that of a hold voltage of the hold capacitor of the peak hold circuit. The droop correction circuit is connected to one end of the hold capacitor of the peak hold circuit.

Patent Document 3 discloses a peak hold circuit that detects a peak value, which is the maximum value or minimum value of an input voltage being a voltage of an input signal in a predetermined period consisting of a plurality of cycles, and outputs an output peak value, which is an output signal.

[Patent Document 1] Japanese Laid-open Patent Publication No. 11-242059
[Patent Document 2] Japanese Laid-open Patent Publication No. 2010-244610
[Patent Document 3] Japanese Laid-open Patent Publication No. 2003-215173

During the period when the peak hold circuit is resetting the voltage holding element, there occurs a dead time during which the voltage holding element fails to output an appropriate hold voltage. The dead time is preferred to be short.

SUMMARY

The voltage hold circuit is a voltage hold circuit configured to operate every processing cycle, the processing cycle including a hold period and a reset period following the hold period, and hold a voltage value for an input voltage signal, the voltage hold circuit including: a first hold circuit configured to operate to hold a minimum voltage value for the input voltage signal in the hold period every the processing cycle; and a second hold circuit configured to operate to hold a maximum voltage value for the input voltage signal in the reset period every the processing cycle.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 13 is a circuit diagram illustrating a configuration example of a voltage hold circuit according to a fourth embodiment;

FIG. 14 is a view illustrating a voltage waveform for explaining the operation of the voltage hold circuit in FIG. 13;

FIG. 16 is a view illustrating a configuration example of a semiconductor integrated circuit according to the fifth embodiment;

FIG. 19 is a view illustrating a configuration example of a semiconductor integrated circuit according to an eighth embodiment;

FIG. 20 is a view illustrating a configuration example of a semiconductor integrated circuit according to a ninth embodiment;

FIG. 24 is a circuit diagram illustrating a configuration example of a constant-current source;

FIG. 25 is a circuit diagram illustrating a configuration example of an inverter;

DESCRIPTION OF EMBODIMENTS

First Embodiment

Figure 1:
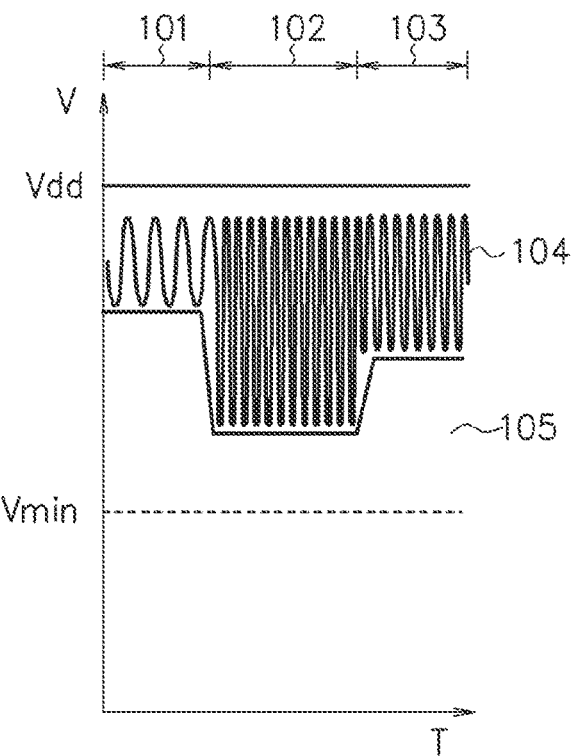
FIG. 1 is a view illustrating a change in a voltage of a power supply voltage node in the case where dynamic voltage scaling (DVS) is not performed.

FIG. 1 is a view illustrating a change in a voltage 104 of a power supply voltage node in the case where dynamic voltage scaling (DVS) is not performed. The horizontal axis indicates a time T and the vertical axis indicates a voltage V. A constant power supply voltage Vdd is supplied to the power supply voltage node. The voltage 104 of the power supply voltage node varies due to voltage drops depending on states 101 to 103 of an internal circuit. In the states 101 to 103, the power supply voltage Vdd is determined so that the minimum voltage value of the voltage 104 of the power supply voltage node does not fall below the minimum operating voltage Vmin. Therefore, the difference between the minimum voltage value of the voltage 104 and the minimum operating voltage Vmin becomes a wasted power 105. In order to reduce the wasted power 105, the dynamic voltage scaling is performed.

Figure 2:
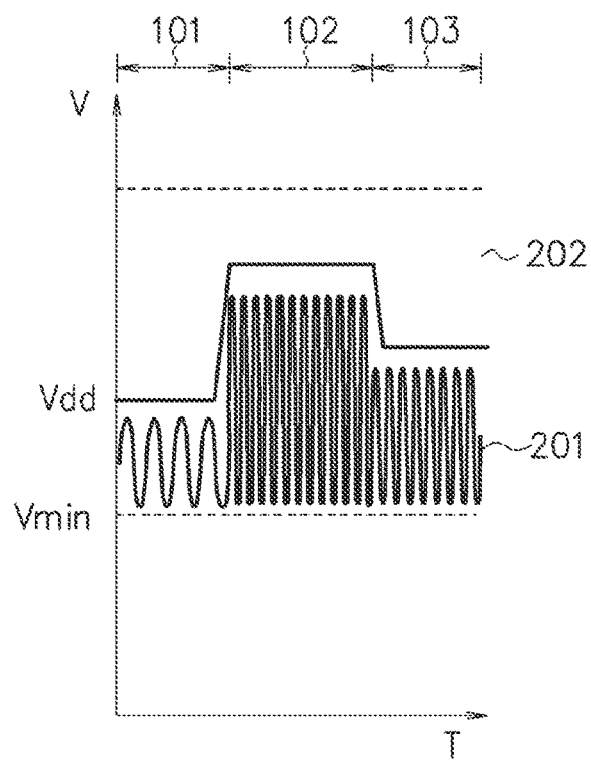
FIG. 2 is a view illustrating a change in a voltage of the power supply voltage node in the case where the dynamic voltage scaling is performed.

FIG. 2 is a view illustrating a change in a voltage 201 of the power supply voltage node in the case where the dynamic voltage scaling is performed. The horizontal axis indicates the time T and the vertical axis indicates the voltage V. The voltage 201 of the power supply voltage node varies due to voltage drops, depending on the states 101 to 103 of the internal circuit. A semiconductor integrated circuit detects the minimum voltage value of the voltage 201 and dynamically controls the power supply voltage Vdd so that the minimum voltage value of the voltage 201 becomes the minimum operating voltage Vmin by the dynamic voltage scaling. The semiconductor integrated circuit dynamically controls the power supply voltage Vdd, thereby making it possible to reduce a power 202.

Figure 3:
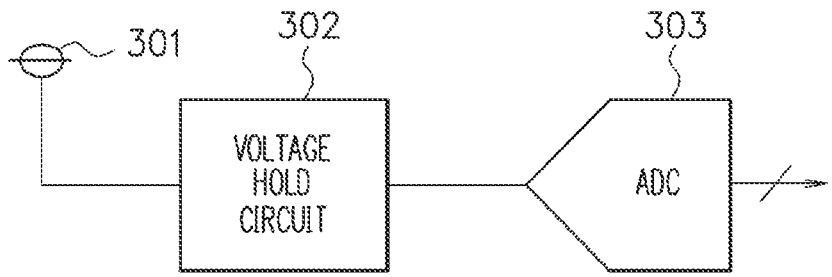
FIG. 3 is a block diagram illustrating a configuration example of a voltage monitoring circuit.
Figure 4:
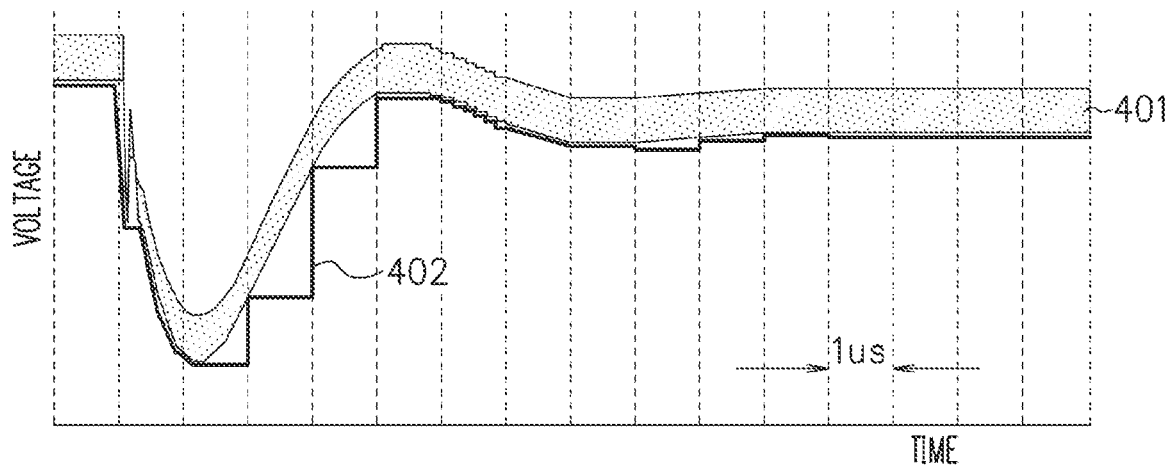
FIG. 4 is a view illustrating a voltage waveform for explaining the operation of the voltage monitoring circuit.

FIG. 3 is a block diagram illustrating a configuration example of a voltage monitoring circuit. FIG. 4 is a view illustrating a voltage waveform for explaining the operation of the voltage monitoring circuit. The voltage monitoring circuit includes a voltage hold circuit 302 and an analog/digital converter 303. The voltage hold circuit 302 receives a voltage signal 401 of a power supply voltage node 301 and holds a minimum voltage value 402 for the voltage signal 401 every predetermined period (for example, 1 μm). The analog/digital converter 303 converts the minimum voltage value held in the voltage hold circuit 302 from an analog value to a digital value.

The drop in the voltage signal 401 is 1 μm or less, and a time axis resolution is in the ns range. Therefore, it is difficult for the analog/digital converter 303 to directly convert the voltage signal 401 of the power supply voltage node 301 from an analog value to a digital value with high accuracy. The voltage monitoring circuit can detect the minimum voltage value every 1 μs, for example, by using the voltage hold circuit 302 to implement the dynamic voltage scaling.

Incidentally, the voltage hold circuit 302 may receive the voltage signal 401 of the power supply voltage node 301 and hold the maximum voltage value for the voltage signal 401 every predetermined period (for example, 1 μs). In this case, the analog/digital converter 303 converts the maximum voltage value held in the voltage hold circuit 302 from an analog value to a digital value.

Figure 5:
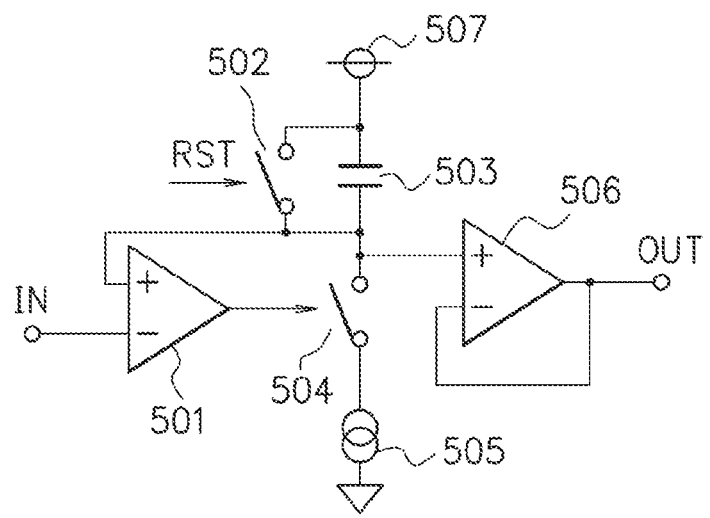
FIG. 5 is a circuit diagram illustrating a configuration example of a voltage hold circuit according to a comparative example.
Figure 6:
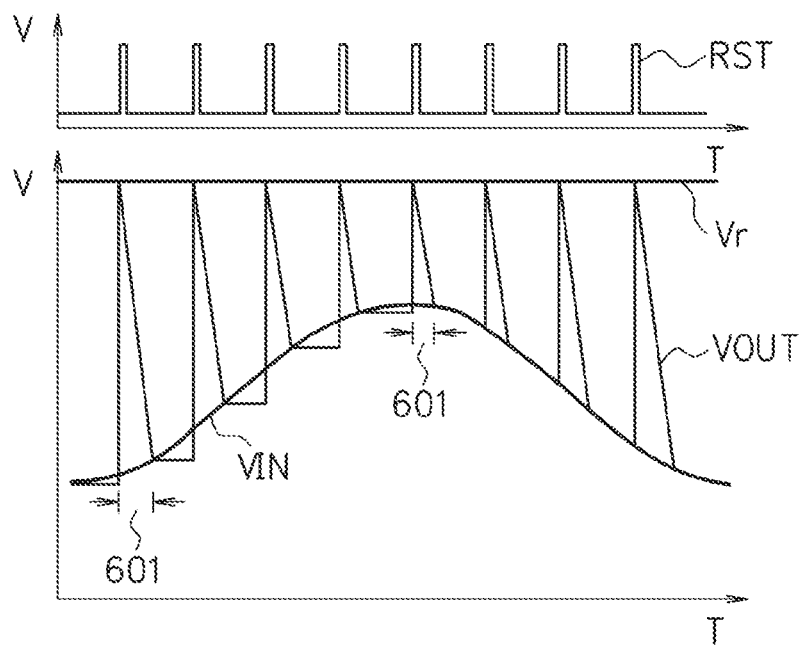
FIG. 6 is a view illustrating a voltage waveform for explaining the operation of the voltage hold circuit in FIG. 5.

FIG. 5 is a circuit diagram illustrating a configuration example of the voltage hold circuit 302 according to a comparative example. FIG. 6 is a view illustrating a voltage waveform for explaining the operation of the voltage hold circuit 302 in FIG. 5. The voltage hold circuit 302 includes a comparator 501, a switch 502, a capacitor 503, a switch 504, a constant-current source 505, an operational amplifier 506, and a power supply voltage node 507. The switch 504 is, for example, an n-channel field-effect transistor.

An input voltage signal VIN is the voltage of an input terminal IN. An output voltage VOUT is the voltage of an output terminal OUT. A reset voltage Vz is the voltage of the power supply voltage node 507. The voltage hold circuit 302 holds the minimum voltage value for the input voltage signal VIN of the input terminal TN. The input terminal IN is connected to a node being a voltage hold target, and is connected to, for example, the power supply voltage node.

In a hold period, a reset signal RST becomes low level. Then, the switch 502 is turned off. In the case where the input voltage signal VIN of the input terminal IN is lower than the minimum voltage value held in the capacitor 503, the comparator 501 outputs a high level, the switch 504 is turned on, and the minimum voltage value held in the capacitor 503 decreases. In contrast to this, in the case where the input voltage signal VIN of the input terminal TN is higher than the minimum voltage value held in the capacitor 503, the comparator 501 outputs a low level, the switch 504 is turned off, and the capacitor 503 maintains the minimum voltage value.

In a reset period, the reset signal RST becomes high level. Then, the switch 502 is turned on, the capacitor 503 holds the reset voltage Vr, and the output voltage VOUT becomes the reset voltage Vr. The switch 504 is off.

The voltage hold circuit 302 holds the minimum voltage value for the input voltage signal VIN of the input terminal IN and outputs the minimum voltage value as the output voltage VOUT in the hold period.

A dead time 601 is a period during which the capacitor 503 is being reset by the high-level reset signal RST, and is a period during which the voltage hold circuit 302 fails to output an appropriate minimum voltage value. Due to a capacitance value of the capacitor 503 and a current of the constant-current source 505, the dead time 601 becomes longer as the difference between the input voltage signal VIN and the reset voltage Vr becomes larger. The dead time 601 is preferred to be short because an appropriate minimum voltage value is not output.

Further, the capacitor 503 is directly connected to the power supply voltage node 507. Therefore, the voltage hold circuit 302 is vulnerable to high frequency fluctuations in the power supply voltage of the power supply voltage node 507.

There is explained a voltage hold circuit that is capable of shortening the dead time 601 and is resistant to the high frequency fluctuations in the power supply voltage.

Figure 7:
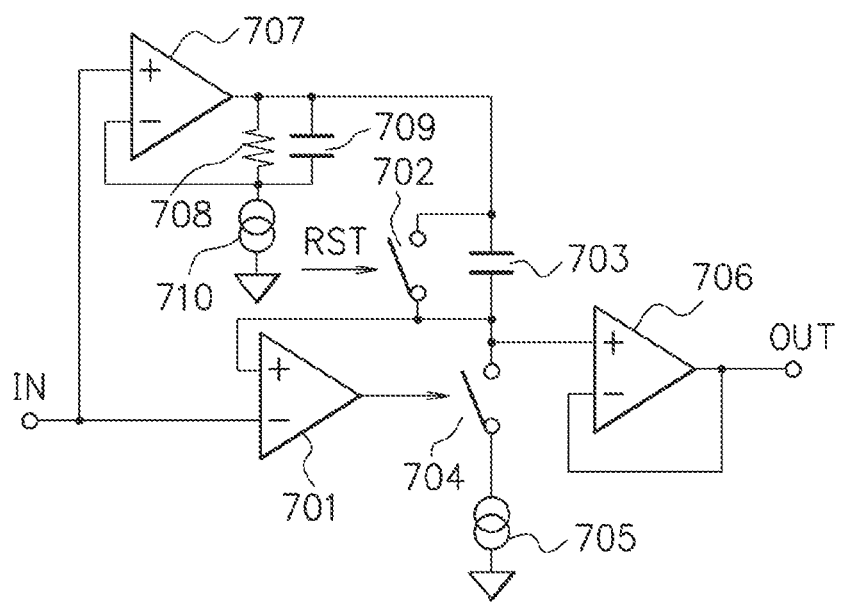
FIG. 7 is a circuit diagram illustrating a configuration example of a voltage hold circuit according to a first embodiment.

FIG. 7 is a circuit diagram illustrating a configuration example of a voltage hold circuit 302 according to a first embodiment. The voltage hold circuit 302 includes a comparator 701, a switch 702, a capacitor 703, a switch 704, a constant-current source 705, operational amplifiers 706, 707, a resistor 708, a capacitor 709, and a constant-current source 710. The switches 702, 704 are an n-channel field-effect transistor, for example.

The comparator 701 has a −input terminal thereof connected to an input terminal IN, has a +input terminal thereof connected to a +input terminal of the operational amplifier 706, and has an output terminal thereof connected to a control terminal of the switch 704. The capacitor 703 is connected between an output terminal of the operational amplifier 707 and the +input terminal of the operational amplifier 706. The switch 702 is connected in parallel to the capacitor 703. A reset signal RST is input to a control terminal of the switch 702. The switch 704 is connected between the +input terminal of the operational amplifier 706 and the constant-current source 705. The constant-current source 705 is connected between the switch 704 and a reference potential node (for example, a ground potential node) having a lower potential than a power supply potential node. The operational amplifier 706 has the −input terminal and an output terminal thereof connected to an output terminal OUT.

The operational amplifier 707 has a +input terminal thereof connected to the input terminal IN and has a −input terminal thereof connected to the output terminal of the operational amplifier 707 via the resistor 708. The capacitor 709 is connected in parallel to the resistor 708. The constant-current source 710 is connected between the −input terminal of the operational amplifier 707 and the reference potential node.

Figure 8:
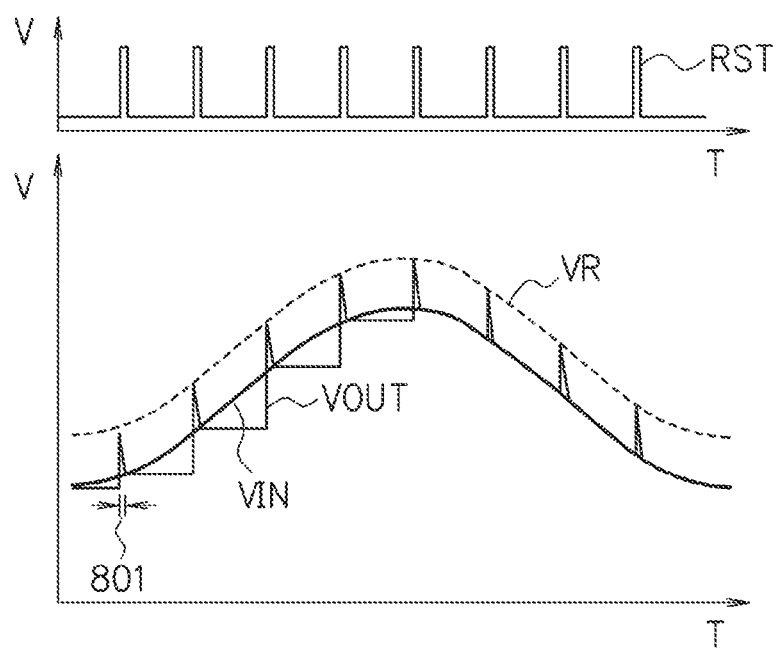
FIG. 8 is a view illustrating a voltage waveform for explaining the operation of the voltage hold circuit in FIG. 7.

FIG. 8 is a view illustrating a voltage waveform for explaining the operation of the voltage hold circuit 302 in FIG. 7. The horizontal axis indicates the time T and the vertical axis indicates the voltage V. The input voltage signal VIN is the voltage of the input terminal IN. The output voltage VOUT is the voltage of the output terminal OUT. A reset voltage signal VR is the voltage of the output terminal of the operational amplifier 707. The voltage hold circuit 302 operates every processing cycle including the hold period and the reset period following the hold period, and holds the minimum voltage value for the input voltage signal VIN of the input terminal IN every processing cycle.

The operational amplifier 707, the resistor 708, the capacitor 709, and the constant-current source 710 are a generation circuit, and generate the reset voltage signal VR that varies according to the input voltage signal VIN. When a resistance value of the resistor 708 is set to R and a current of the constant-current source 710 is set to I, the reset voltage signal VR is expressed by the following equation. The reset voltage signal VR is a signal having a voltage value that is larger than the voltage value of the input voltage signal VIN by I×R (a first value).

$$VR = VIN + I \times R$$

In the hold period, the reset signal RST becomes low level. Then, the switch 702 is turned off. In the case where the input voltage signal VIN of the input terminal IN is lower than the minimum voltage value held in the capacitor 703, the comparator 701 outputs a high level, the switch 704 is turned on, and the minimum voltage value held in the capacitor 703 decreases. In contrast to this, in the case where the input voltage signal VIN of the input terminal IN is higher than the minimum voltage value held in the capacitor 703, the comparator 701 outputs a low level, the switch 704 is turned off, and the capacitor 703 maintains the minimum voltage value.

The comparator 701, the capacitor 703, the switch 704, and the constant-current source 705 are a hold circuit, and operate to hold the minimum voltage value for the input voltage signal VIN in the hold period every processing cycle. The switch 704 connects the capacitor 703 to the reference potential node in the case where the voltage value of the input voltage signal VIN is smaller than the minimum voltage value held in the capacitor 103.

In the reset period, the reset signal RST becomes high level. Then, the switch 702 is turned on, the capacitor 703 holds the voltage value of the reset voltage signal VR, and the output voltage VOUT becomes the reset voltage signal VR. The switch 704 is off.

The voltage hold circuit 302 holds the minimum voltage value for the input voltage signal VIN of the input terminal IN and outputs the minimum voltage value as the output voltage VOUT in the hold period.

The switch 702 is a reset circuit, and resets the output voltage VOUT based on the reset voltage signal VR in the reset period every processing cycle.

A dead time 801 is a period during which the capacitor 703 is being reset by the high-level reset signal RST, and is a period during which the voltage hold circuit 302 fails to output an appropriate minimum voltage value. The difference between the input voltage signal VIN and the reset voltage signal VR is small, and thus the dead time 801 can be shortened. The dead time 801 is shorter than the dead time 601 in FIG. 6.

Further, the capacitor 703 is not directly connected to the power supply voltage node, and thus the voltage hold circuit 302 is resistant to the high frequency fluctuations in the power supply voltage.

Incidentally, the voltage hold circuit 302 can be formed into a circuit to hold the maximum voltage value for the input voltage signal VIN by changing the circuit configuration from the circuit illustrated in FIG. 7 and reversing the direction of the current. In this case, the operational amplifier 707, the resistor 708, the capacitor 709, and the constant-current source 710 are a generation circuit and generate the reset voltage signal VR that varies according to the input voltage signal VIN. The comparator 701, the capacitor 703, the switch 704, and the constant-current source 705 are a hold circuit, and operate to hold the maximum voltage value for the input voltage signal VIN in the hold period. The switch 702 is a reset circuit and resets the output voltage VOUT based on the reset voltage signal VR in the reset period.

Second Embodiment

Figure 9:
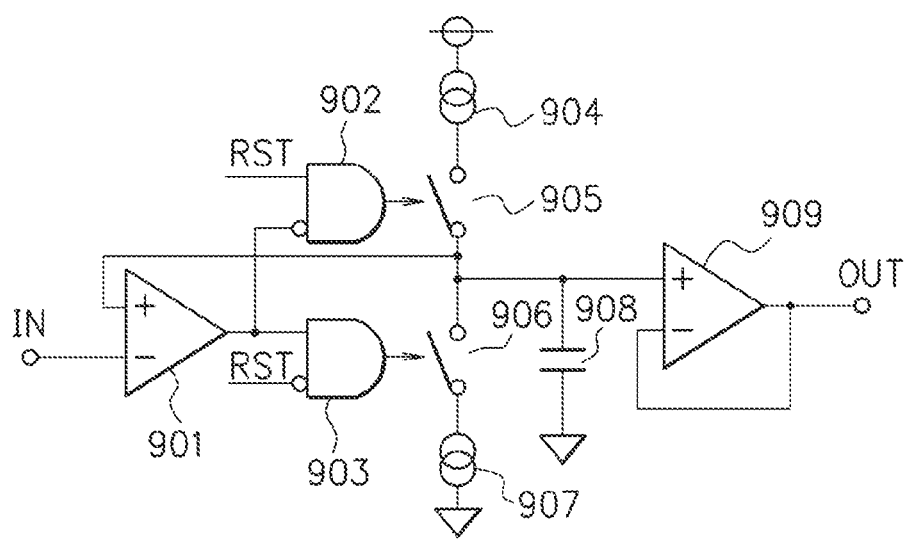
FIG. 9 is a circuit diagram illustrating a configuration example of a voltage hold circuit according to a second embodiment.

FIG. 9 is a circuit diagram illustrating a configuration example of a voltage hold circuit 302 according to a second embodiment. The voltage hold circuit 302 includes a comparator 901, logical product (AND) circuits 902, 903, a constant-current source 904, switches 905, 906, a constant-current source 907, a capacitor 908, and an operational amplifier 909. The switches 905, 906 are an n-channel field-effect transistor, for example.

The comparator 901 has a −input terminal thereof connected to an input terminal IN, and has a +input terminal thereof connected to a +input terminal of the operational amplifier 909. The logical product circuit 902 outputs a logical product signal of a reset signal RST and a logically inverted signal of an output signal of the comparator 901 to a control terminal of the switch 905. The logical product circuit 903 outputs a logical product signal of the output signal of the comparator 901 and a logically inverted signal of the reset signal RST to a control terminal of the switch 906.

The constant-current source 904 is connected between a power supply voltage node and the switch 905. The switch 905 is connected between the constant-current source 904 and the +input terminal of the operational amplifier 909. The switch 906 is connected between the +input terminal of the operational amplifier 909 and the constant-current source 907. The constant-current source 907 is connected between the switch 906 and a reference potential node. The capacitor 908 is connected between the +input terminal of the operational amplifier 909 and the reference potential node. The operational amplifier 909 has a −input terminal thereof and an output terminal thereof connected to an output terminal OUT.

Figure 10:
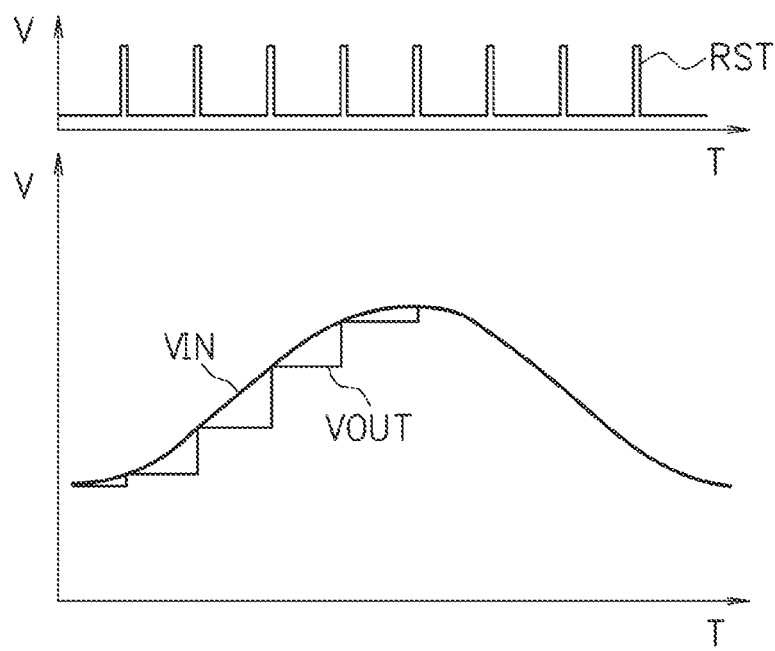
FIG. 10 is a view illustrating a voltage waveform for explaining the operation of the voltage hold circuit in FIG. 9.

FIG. 10 is a view illustrating a voltage waveform for explaining the operation of the voltage hold circuit 302 in FIG. 9. The horizontal axis indicates the time T and the vertical axis indicates the voltage V. The input voltage signal VIN is the voltage of the input terminal IN. The output voltage VOUT is the voltage of the output terminal OUT. The voltage hold circuit 302 operates every processing cycle including the hold period and the reset period following the hold period, and holds the minimum voltage value for the input voltage signal VIN of the input terminal IN every processing cycle.

The high-level period of the reset signal RST is the reset period. The low-level period of the reset signal RST is the hold period.

The comparator 901, the logical product circuit 903, the switch 906, the constant-current source 907, and the capacitor 908 are a hold circuit, and operate to hold the minimum voltage value for the input voltage signal VIN in the hold period every processing cycle. In the hold period, the reset signal RST is in the low-level period, and thus the output signal of the logical product circuit 903 varies according to the output signal of the comparator 901. Therefore, the switch 906 is brought into a state of being able to be turned on in the hold period, and in the case where the voltage value of the input voltage signal VIN is smaller than the minimum voltage value held in the capacitor 908, the capacitor 908 is connected to the constant-current source 907 and the reference potential node (for example, the ground potential node). Incidentally, the direction of the current of the constant-current source 907 is the direction of extracting electric charges from the capacitor 908 (the first direction). On the other hand, in the reset period, the switch 906 fixes the output signal of the logical product circuit 903 to low level since the reset signal RST is in the high-level period. Therefore, the switch 906 is turned off in the reset period.

The comparator 901, the logical product circuit 902, the constant-current source 904, the switch 905, and the capacitor 908 are a hold circuit, and operate to hold the maximum voltage value for the input voltage signal VIN in the reset period following the hold period every processing cycle. In the reset period, the reset signal RST is in the high-level period, and thus the output signal of the logical product circuit 902 varies according to the output signal of the comparator 901. Therefore, the switch 905 is brought into a state of being able to be turned on in the reset period, and in the case where the voltage value of the input voltage signal VIN is larger than the maximum voltage value held in the capacitor 908, the capacitor 908 is connected to the constant-current source 904 and the power supply voltage node. Incidentally, the direction of the current of the constant-current source 904 is the direction of injecting electric charges into the capacitor 908 (the second direction). On the other hand, in the hold period, the switch 905 fixes the output signal of the logical product circuit 902 to low level since the reset signal RST is in the low-level period. Therefore, the switch 905 is turned off in the hold period.

The voltage hold circuit 302 holds the maximum voltage value in the reset period, and thus the dead time can be shortened.

Incidentally, the voltage hold circuit 302 can be formed into a circuit to hold the maximum voltage value for the input voltage signal VIN in the hold period by changing the circuit configuration from the circuit illustrated in FIG. 9 and reversing the direction of the current. In this case, the comparator 901, the logical product circuit 903, the switch 906, the constant-current source 907, and the capacitor 908 are a hold circuit, and operate to hold the maximum voltage value for the input voltage signal VIN in the hold period. The comparator 901, the logical product circuit 902, the constant-current source 904, the switch 905, and the capacitor 908 are a hold circuit, and operate to hold the minimum voltage value for the input voltage signal VIN in the reset period following the hold period.

Third Embodiment

Figure 11:
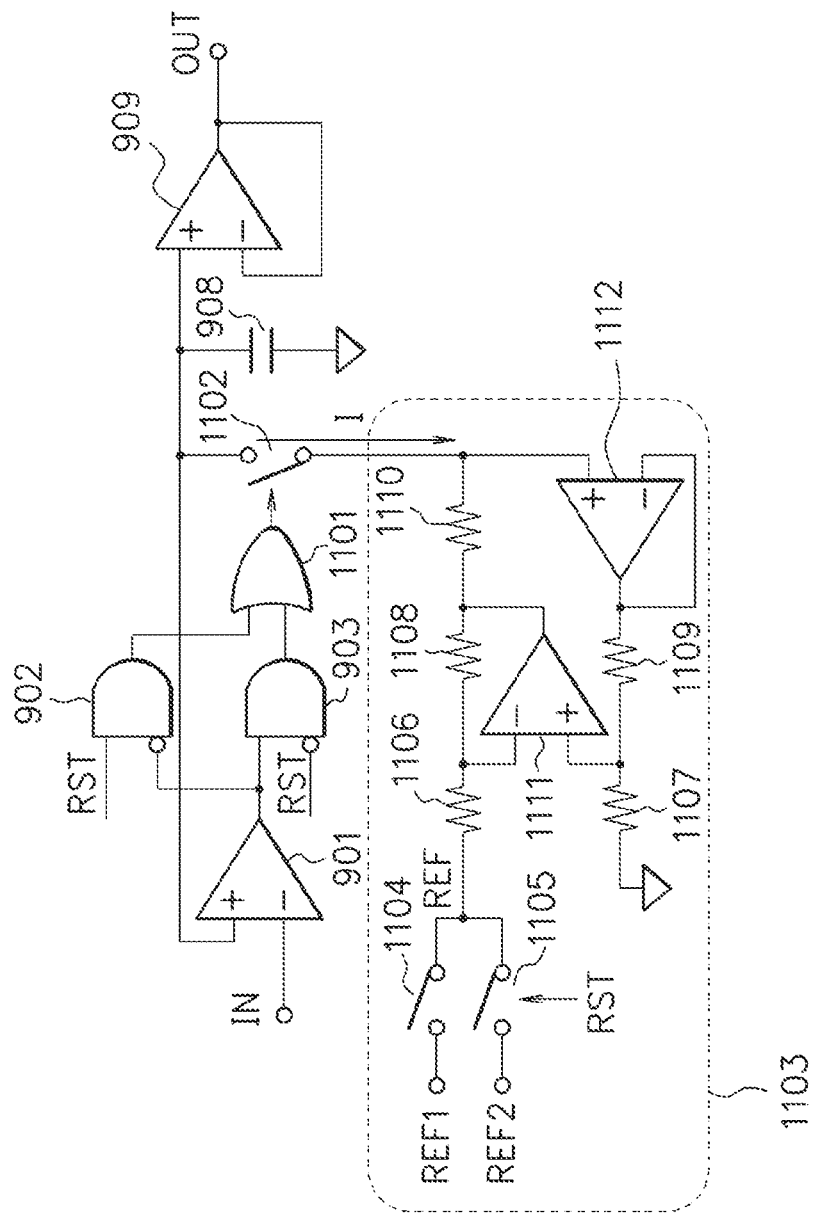
FIG. 11 is a circuit diagram illustrating a configuration example of a voltage hold circuit according to a third embodiment.

FIG. 11 is a circuit diagram illustrating a configuration example of a voltage hold circuit 302 according to a third embodiment. FIG. 11 is that the constant-current sources 904, 907 and the switches 905, 906 are deleted from and a logical sum (OR) circuit 1101, a switch 1102, and a bidirectional current source 1103 are added to FIG. 9. The voltage hold circuit 302 in FIG. 11 operates in the same manner as the voltage hold circuit 302 in FIG. 9. The switch 1102 is an n-channel field-effect transistor, for example.

The logical sum circuit 1101 outputs a logical sum signal of an output signal of the logical product circuit 902 and an output signal of the logical product circuit 903 to a control terminal of the switch 1102. The switch 1102 is connected between the +input terminal of the operational amplifier 909 and the bidirectional current source 1103. The bidirectional current source 1103 includes switches 1104, 1105, resistors 1106 to 1110, and operational amplifiers 1111, 1112, and is a current source in which the direction of current is reversed between the hold period and the reset period following the hold period. The switches 1104, 1105 are an n-channel field-effect transistor, for example.

Figure 12:
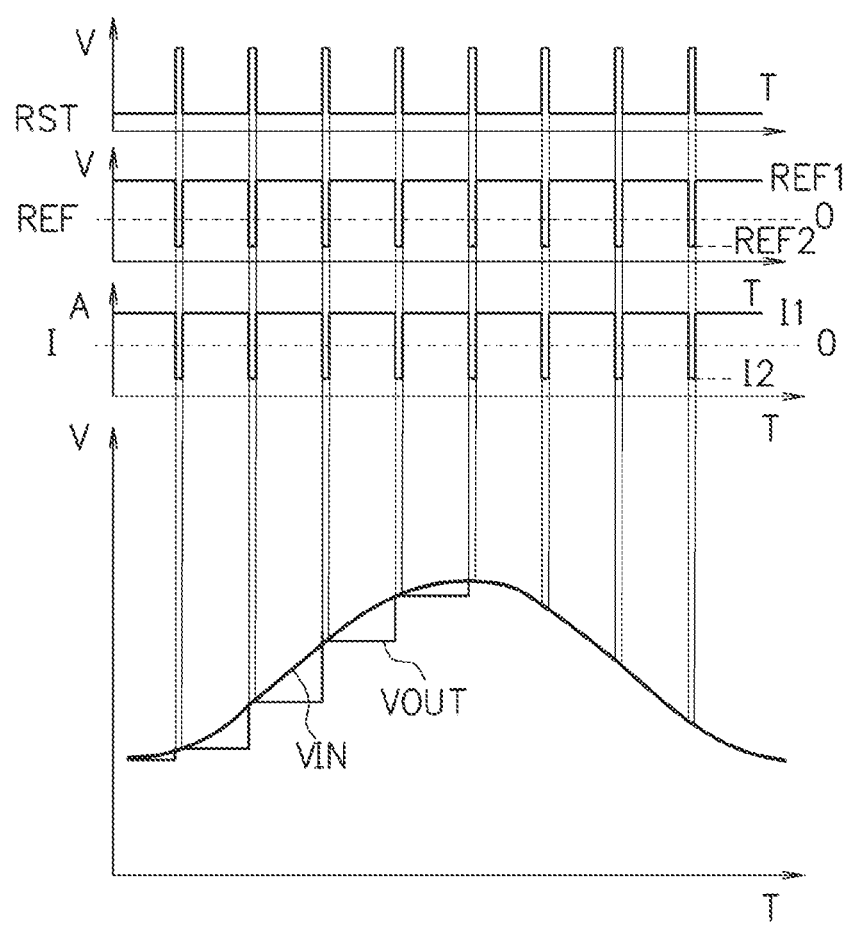
FIG. 12 is a view illustrating a voltage waveform and a current waveform for explaining the operation of the voltage hold circuit in FIG. 11.

FIG. 12 is a view illustrating a voltage waveform and a current waveform for explaining the operation of the voltage hold circuit 302 in FIG. 11. The input voltage signal VIN is the voltage of the input terminal IN. The output voltage VOUT is the voltage of the output terminal OUT. The voltage hold circuit 302 operates every processing cycle including the hold period and the reset period following the hold period, and holds the minimum voltage value for the input voltage signal VIN of the input terminal IN every processing cycle.

The high-level period of the reset signal RST is the reset period. The low-level period of the reset signal RST is the hold period.

In the hold period, the reset signal RST is low level. Then, the switch 1105 is turned off, the switch 1104 is turned on, and a voltage REF becomes a voltage REF1. The voltage REF1 is a positive voltage. A current I flowing through the switch 1102 becomes a positive current I1. The positive current I1 is a current to flow in the direction of extracting electric charges from the capacitor 908 (the first direction). That is, the direction of the current of the bidirectional current source 1103 becomes the direction of extracting electric charges from the capacitor 908 (the first direction) in the hold period according to the level of the reset signal RST. The comparator 901, the logical product circuit 903, the switch 1102, the bidirectional current source 1103, and the capacitor 908 are a hold circuit, and operate to hold the minimum voltage value for the input voltage signal VIN in the hold period every processing cycle.

When the resistance value of the resistor 1110 is set to R, the current I flowing through the switch 1102 is expressed by the following equation.

$$I=REF/R$$

In the reset period, the reset signal RST is high level. Then, the switch 1104 is turned off, the switch 1105 is turned on, and the voltage REF becomes a voltage REF2. The voltage REF2 is a negative voltage. The current I flowing through the switch 1102 becomes a negative current I2. The negative current I2 is a current to flow in the direction of injecting electric charges into the capacitor 908 (the second direction). That is, the direction of the current of the bidirectional current source 1103 becomes the direction of injecting electric charges into the capacitor 908 (the second direction) in the reset period according to the level of the reset signal RST, and is reverse to the direction of the current in the hold period. The comparator 901, the logical product circuit 902, the switch 1102, the bidirectional current source 1103, and the capacitor 908 are a hold circuit, and operate to hold the maximum voltage value for the input voltage signal VIN in the reset period following the hold period every processing cycle.

Incidentally, the voltage hold circuit 302 can be formed into a circuit to hold the maximum voltage value for the input voltage signal VIN in the hold period by changing the circuit configuration from the circuit illustrated in FIG. 11 and reversing the direction of the current. In this case, the comparator 901, the logical product circuit 903, the switch 1102, the bidirectional current source 1103, and the capacitor 908 are a hold circuit, and operate to hold the maximum voltage value for the input voltage signal VIN in the hold period. The comparator 901, the logical product circuit 902, the switch 1102, the bidirectional current source 1103, and the capacitor 908 are a hold circuit, and operate to hold the minimum voltage value for the input voltage signal VIN in the reset period following the hold period.

Fourth Embodiment

FIG. 13 is a circuit diagram illustrating a configuration example of a voltage hold circuit 302 according to a fourth embodiment. The voltage hold circuit 302 includes a comparator 1301, logical product circuits 1302, 1303, a constant-current source 1304, switches 1305, 1306, a constant-current source 1307, a capacitor 1308, an operational amplifier 1309, and a determination circuit 1310. The determination circuit 1310 includes a resistor 1311, a capacitor 1312, and a comparator 1313.

The comparator 1301 has a −input terminal thereof connected to an input terminal IN, and has a +input terminal thereof connected to a +input terminal of the operational amplifier 1309. The logical product circuit 1302 outputs a logical product signal of a signal CONT and a logically inverted signal of an output signal of the comparator 1301 to a control terminal of the switch 1305. The logical product circuit 1303 outputs a logical product signal of the output signal of the comparator 1301 and a logically inverted signal of the signal CONT to a control terminal of the switch 1306.

The constant-current source 1304 is connected between a power supply voltage node and the switch 1305. The switch 1305 is connected between the constant-current source 1304 and the +input terminal of the operational amplifier 1309. The switch 1306 is connected between the +input terminal of the operational amplifier 1309 and the constant-current source 1307. The constant-current source 1307 is connected between the switch 1306 and a reference potential node. The capacitor 1308 is connected between the +input terminal of the operational amplifier 1309 and the reference potential node. The operational amplifier 1309 has a −input terminal thereof and an output terminal thereof connected to an output terminal OUT.

The resistor 1311 is connected between the input terminal IN and a +input terminal of the comparator 1313. The capacitor 1312 is connected between the +input terminal of the comparator 1313 and the reference potential node. An output terminal of the comparator 1313 outputs the signal CONT.

FIG. 14 is a view illustrating a voltage waveform for explaining the operation of the voltage hold circuit 302 in FIG. 13. The horizontal axis indicates the time T and the vertical axis indicates the voltage V. The input voltage signal VIN is the voltage of the input terminal IN. The output voltage VOUT is the voltage of the output terminal OUT. A voltage 1401 is the voltage of the +input terminal of the comparator 1313, and is a signal obtained by delaying the input voltage signal VIN.

The determination circuit 1310 is a differential circuit, and determines the increase or decrease in the input voltage signal. VIN. When the input voltage signal VIN increases, the determination circuit 1310 outputs a low-level signal CONT. The comparator 1301, the logical product circuit 1303, the switch 1306, the constant-current source 1307, and the capacitor 1308 are a hold circuit, and operate to hold the minimum voltage value for the input voltage signal VIN every period (first period) when the determination circuit 1310 determines the increase in the input voltage signal VIN. The switch 1306 connects the capacitor 1308 to the reference potential node in the case where the voltage value of the input voltage signal VIN is smaller than the minimum voltage value held in the capacitor 1308 when the input voltage signal VIN increases in the period when the determination circuit 1310 determines the increase in the input voltage signal.

The determination circuit 1310 outputs a high-level signal CONT when the input voltage signal VIN decreases. The comparator 1301, the logical product circuit 1302, the constant-current source 1304, the switch 1305, and the capacitor 1308 are a hold circuit, and operate to hold the maximum voltage value for the input voltage signal VIN when the input voltage signal VIN decreases every period (second period) when the determination circuit 1310 determines the decrease in the input voltage signal VIN. The switch 1305 connects the capacitor 1308 to the power supply voltage node in the case where the voltage value of the input voltage signal VIN is larger than the maximum voltage value held in the capacitor 1308 when the input voltage signal VIN decreases in the period when the determination circuit 1310 determines the decreases in the input voltage signal.

As above, the voltage hold circuit 302 holds the minimum voltage value of the input voltage signal VIN when the input voltage signal VIN increases, and holds the maximum voltage value of the input voltage signal VIN when the input voltage signal VIN decreases. This makes it possible to shorten the dead time.

Fifth Embodiment

Figure 15:
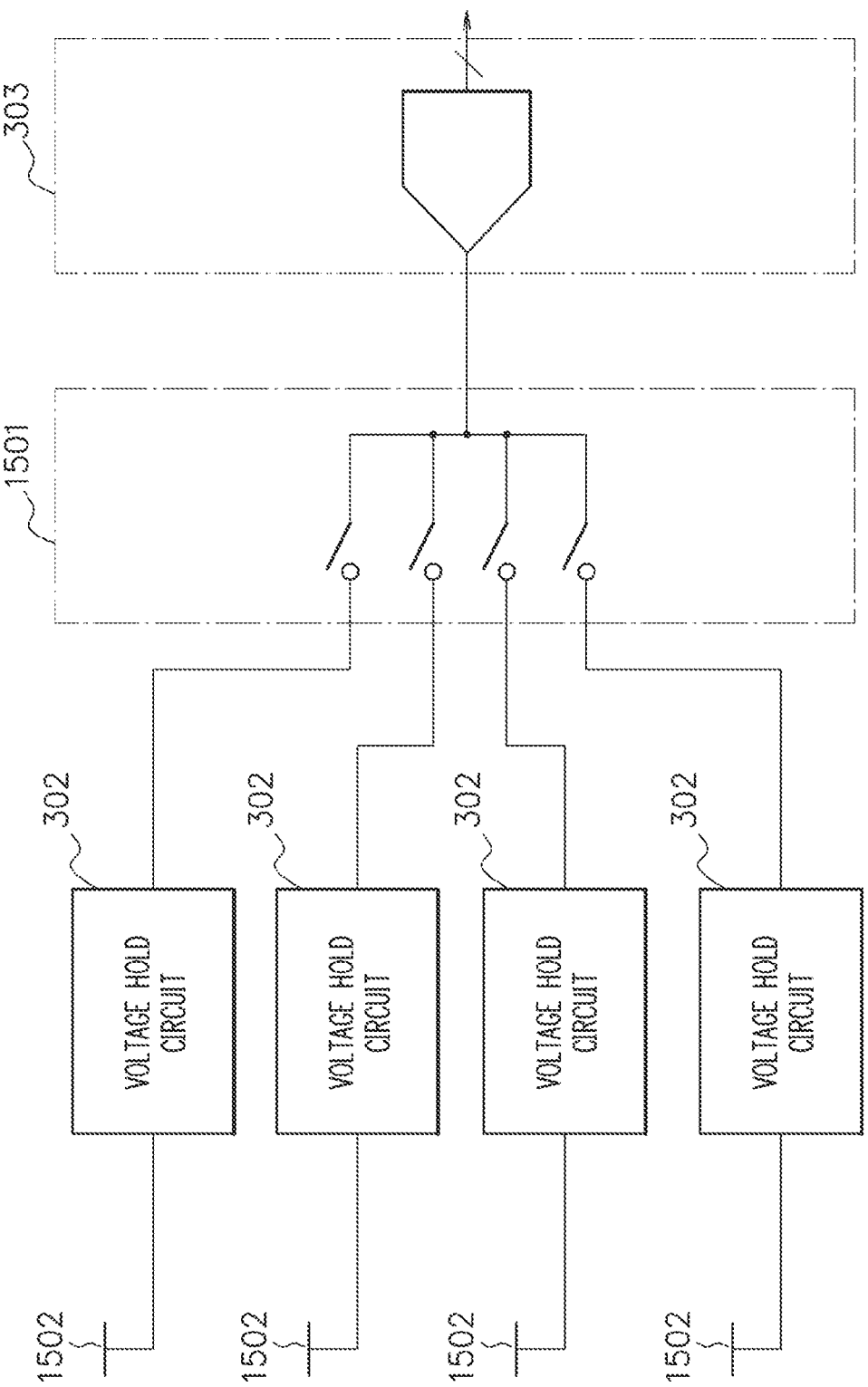
FIG. 15 is a view illustrating a configuration example of a voltage monitoring circuit according to a fifth embodiment.

FIG. 15 is a view illustrating a configuration example of a voltage monitoring circuit according to a fifth embodiment. The voltage monitoring circuit includes a plurality of the voltage hold circuits 302, an analog/digital converter 303, and a switching circuit 1501 provided between a plurality of the voltage hold circuits 302 and the analog/digital converter 303. A plurality of the voltage hold circuits 302 are the voltage hold circuits 302 in the first to fourth embodiments, and each hold the minimum voltage value or maximum voltage value of a power supply voltage node 1502 to be monitored. That is, the input voltage signal VIN of each of the voltage hold circuits 302 is the power supply voltage of the corresponding power supply voltage node 1502 to be monitored. The switching circuit 1501 outputs the minimum voltage values or maximum voltage values held in a plurality of the voltage hold circuits 302 to the analog/digital converter 303 in a time division manner. The analog/digital converter 303 sequentially converts the minimum voltage value or maximum voltage value output by the switching circuit 1501 in a time division manner from an analog value to a digital value. The voltage monitoring circuit can monitor the minimum voltage values or maximum voltage values of a plurality of the power supply voltage nodes 1502 with the analog/digital converter 303, which is smaller in number than a plurality of the power supply voltage nodes 1502.

FIG. 16 is a diagram illustrating a configuration example of a semiconductor integrated circuit 1600 according to the fifth embodiment. The semiconductor integrated circuit includes the voltage monitoring circuit illustrated in FIG. 15 and a power supply voltage network 1601. The power supply voltage is applied to the power supply voltage network 1601. A plurality of the voltage hold circuits 302 can set the power supply voltages of a plurality of the power supply voltage nodes in the power supply voltage network 1601 as monitoring targets to hold the minimum voltage values or maximum voltage values thereof.

Sixth Embodiment

Figure 17:
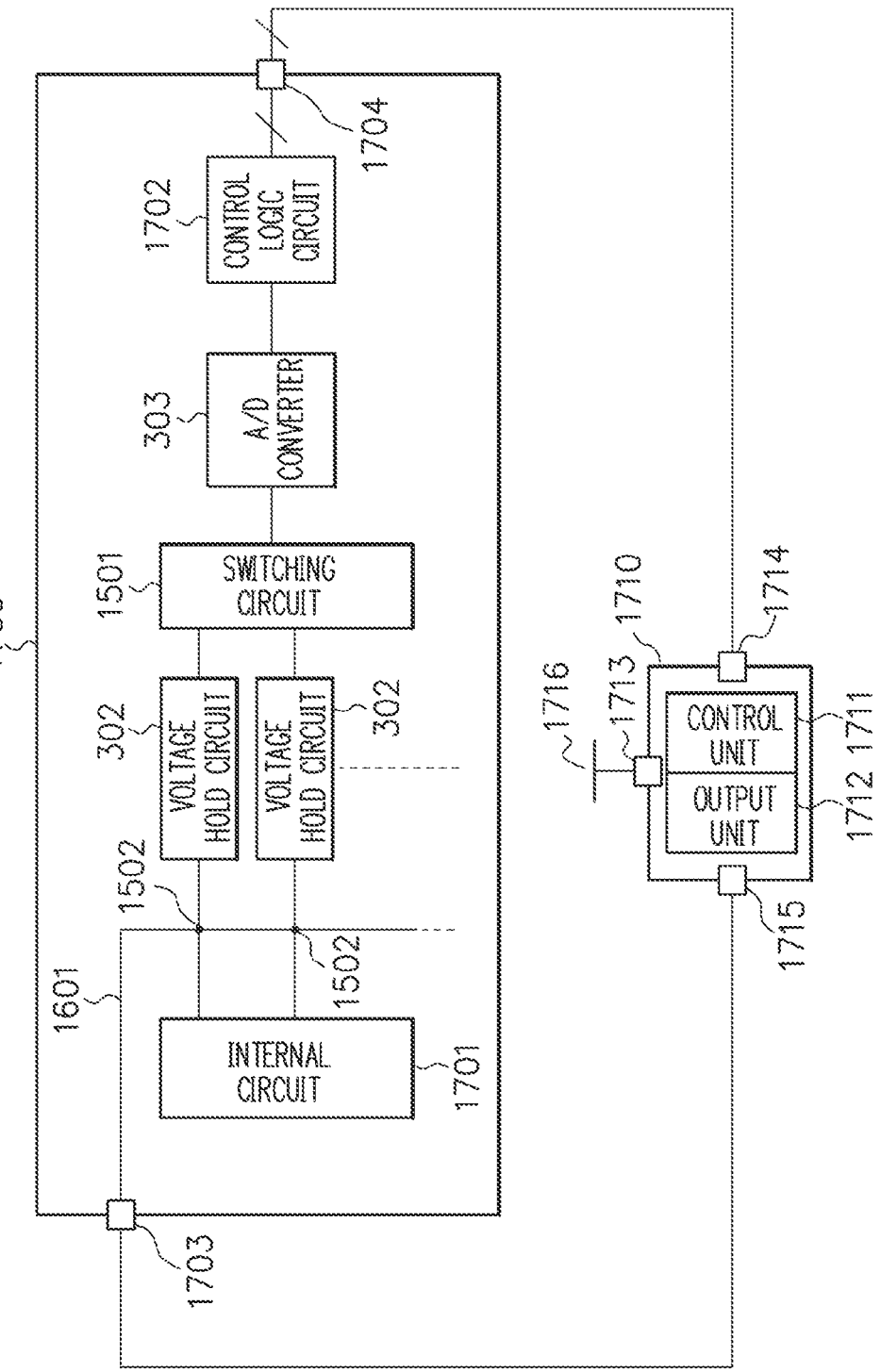
FIG. 17 is a view illustrating a configuration example of a semiconductor integrated circuit according to a sixth embodiment.

FIG. 17 is a diagram illustrating a configuration example of a semiconductor integrated circuit 1700 according to a sixth embodiment. The semiconductor integrated circuit 1700 includes a power supply input terminal 1703, the power supply voltage network 1601, an internal circuit 1701, a plurality of the voltage hold circuits 302, the switching circuit 1501, the analog/digital converter 303, a control logic circuit 1702, and a control output terminal 1704.

A power supply circuit 1710 includes a control unit 1711, an output unit 1712, a power supply input terminal. 1713, a control input terminal 1714, and a power supply output terminal 1715. The power supply input terminal 1713 is connected to a system power supply voltage node 1716.

The output unit 1712 supplies the power supply voltage to the power supply voltage network 1601 through the power supply output terminal 1715 and the power supply input terminal 1703. A plurality of the power supply voltage nodes 1502 are provided in the power supply voltage network 1601, and are nodes being a voltage hold target. The internal circuit 1701 receives the power supply voltages supplied from a plurality of the power supply voltage nodes 1502 to perform processing. Thereby, the power supply voltage of the power supply voltage node 1502 varies.

A plurality of the voltage hold circuits 302 are the voltage hold circuits 302 in the first to fourth embodiments, and hold the minimum voltage values or maximum voltage values of a plurality of the power supply voltage nodes 1502 respectively. That is, the input voltage signal VIN of each of the voltage hold circuits 302 is the power supply voltage of the corresponding power supply voltage node 1502 to be monitored. The switching circuit 1501 outputs the minimum voltage values or maximum voltage values held in a plurality of the voltage hold circuits 302 to the analog/digital converter 303 in a time division manner. The analog/digital converter 303 converts the minimum voltage value or maximum voltage value input from the switching circuit 1501 in a time division manner from an analog value to a digital value.

The control logic circuit 1702 receives the minimum voltage value or maximum voltage value from the analog/digital converter 303 and outputs a control signal intended for controlling the power supply voltage to the control unit 1711 through the control output terminal 1704 and the control input terminal 1714. The control unit 1711 controls the output unit 1712 based on the control signal. The output unit 1712 outputs a power supply voltage according to the control signal to the power supply voltage network 1601 through the power supply output terminal 1715 and the power supply input terminal 1703. Thereby, the dynamic voltage scaling is performed.

Seventh Embodiment

Figure 18:
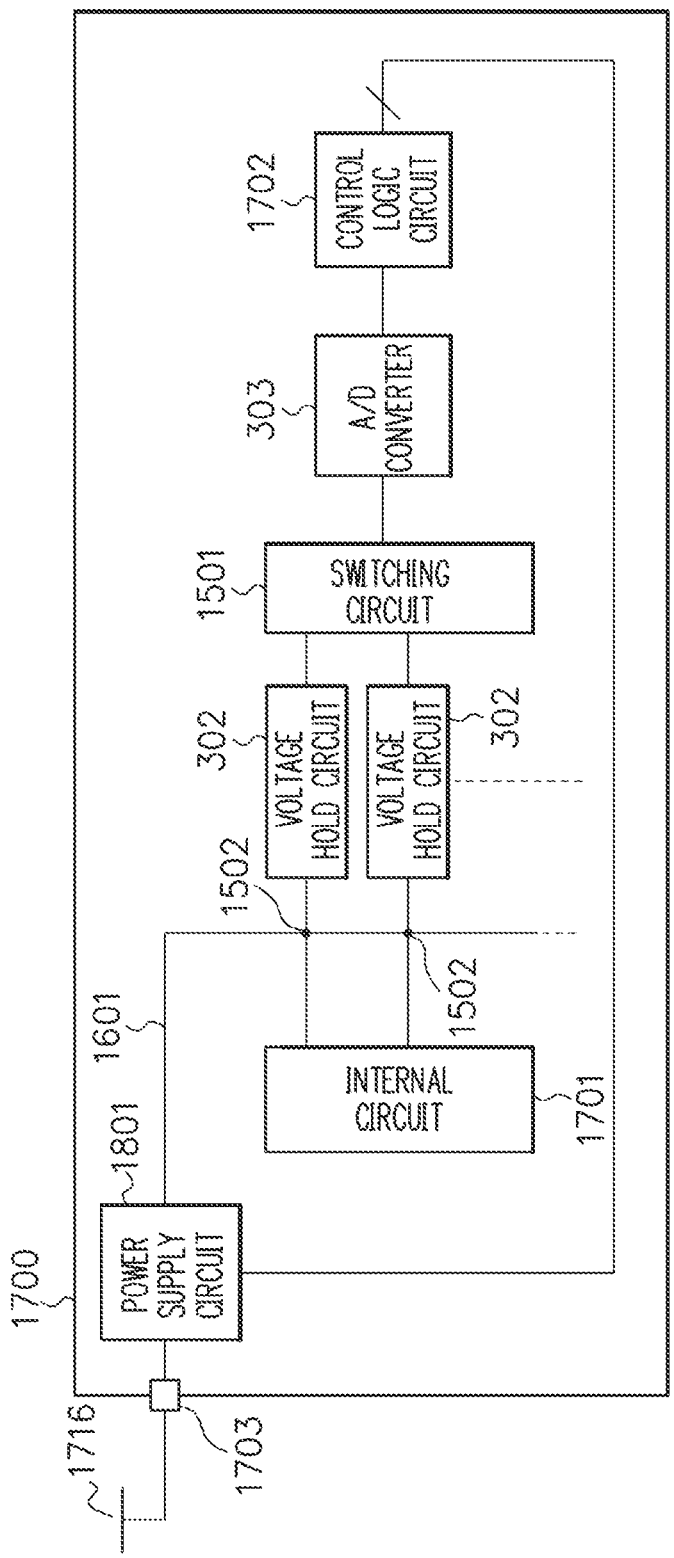
FIG. 18 is a view illustrating a configuration example of a semiconductor integrated circuit according to a seventh embodiment.

FIG. 18 is a diagram illustrating a configuration example of a semiconductor integrated circuit 1700 according to a seventh embodiment. The semiconductor integrated circuit 1700 in FIG. 18 is that the power supply circuit 1710 is deleted from and a power supply circuit 1801 is added to the semiconductor integrated circuit 1700 in FIG. 17. The power supply circuit 1801 is provided in the semiconductor integrated circuit 1700. The system power supply voltage node 1716 is connected to the power supply circuit 1801 via the power supply input terminal 1703. The control logic circuit 1702 receives the minimum voltage value or maximum voltage value from the analog/digital converter 303 and outputs a control signal intended for controlling the power supply voltage to the power supply circuit 1801. The power supply circuit 1801 controls the power supply voltage to be supplied to the power supply voltage network 1601 based on the control signal output by the control logic circuit 1702.

Eighth Embodiment

FIG. 19 is a diagram illustrating a configuration example of a semiconductor integrated circuit 1700 according to an eighth embodiment. The semiconductor integrated circuit 1700 in FIG. 19 is that the power supply circuit 1801 is deleted from and a safety mechanism block 1901 is added to the semiconductor integrated circuit 1700 in FIG. 18. The safety mechanism block 1901 is a circuit that detects abnormalities in the minimum voltage values or maximum voltage values of the power supply voltages supplied from a plurality of the power supply voltage nodes 1502 based on the control signal output by the control logic circuit 1702, and outputs a reset signal or alarm signal to ensure the safety in the event of an abnormality. The internal circuit 1701 receives the reset signal from the safety mechanism block 1901, for example, and resets the internal operation. In addition, the internal circuit 1701 receives the alarm signal from the safety mechanism block 1901, for example, and changes an internal operating condition and operating mode.

Ninth Embodiment

FIG. 20 is a diagram illustrating a configuration example of a semiconductor integrated circuit 1700 according to a ninth embodiment. The semiconductor integrated circuit 1700 in FIG. 20 is that the internal circuit 1701, the power supply input terminal 1703, and the control output terminal 1704 are deleted from and a signal input terminal 2002 and a signal processing block 2003 are added to the semiconductor integrated circuit 1700 in FIG. 17. A plurality of signal sources 2001 are, for example, sensors whose voltage is displaced at high speed, and are connected to a plurality of the voltage hold circuits 302 via a plurality of the signal input terminals 2002 respectively. A plurality of the voltage hold circuits 302 are the voltage hold circuits 302 in the first to fourth embodiments, and hold the minimum voltage values or maximum voltage values of a plurality of the signal sources 2001 respectively. That is, the input voltage signal VIN of each of the voltage hold circuits 302 is the output signal of the corresponding signal source 2001 to be monitored. The control logic circuit 1702 receives the digital minimum voltage value or maximum voltage value from the analog/digital converter 303 and outputs a control signal intended for controlling signal processing to the signal processing block 2003. The signal processing block 2003 is a circuit that performs signal processing based on the control signal output by the control logic circuit 1702.

Other Embodiments

Figure 21:
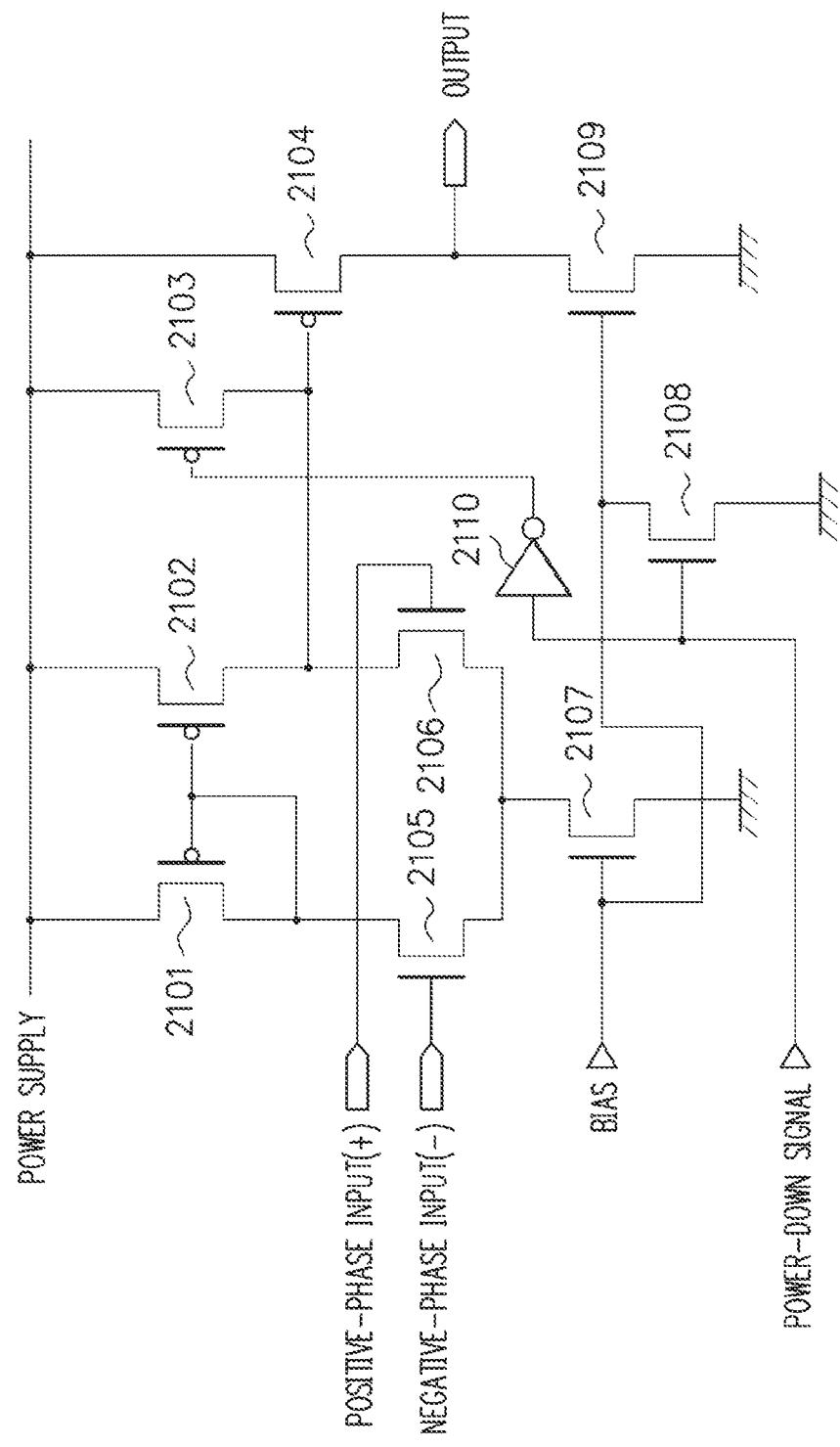
FIG. 21 is a circuit diagram illustrating a configuration example of an operational amplifier.

FIG. 21 is a circuit diagram illustrating a configuration example of the above-described operational amplifier. A p-channel field-effect transistor 2101 has a source thereof connected to the power supply voltage node and has a gate thereof connected to a drain. An n-channel field-effect transistor 2105 has a drain thereof connected to the drain of the p-channel field-effect transistor 2101, has a gate thereof connected to a −input terminal (negative-phase input terminal), and has a source thereof connected to a drain of an n-channel field-effect transistor 2107.

A p-channel field-effect transistor 2102 has a source thereof connected to the power supply voltage node, has a gate thereof connected to the gate of the p-channel field-effect transistor 2101, and has a drain thereof connected to a drain of an n-channel field-effect transistor 2106. The n-channel field-effect transistor 2106 has a gate thereof connected to a +input terminal (positive-phase input terminal) and has a source thereof connected to the drain of the n-channel field-effect transistor 2107. The n-channel field-effect transistor 2107 has a gate thereof connected to a bias terminal and has a source thereof connected to the reference potential node.

A gate of an n-channel field-effect transistor 2108 receives a power-down signal. An inverter 2110 outputs a logically inverted signal of the power-down signal to a gate of a p-channel field-effect transistor 2103.

The p-channel field-effect transistor 2103 has a source thereof connected to the power supply voltage node and has a drain thereof connected to the drain of the n-channel field-effect transistor 2106. The n-channel field-effect transistor 2108 has a drain thereof connected to the bias terminal and has a source thereof connected to the reference potential node.

A p-channel field-effect transistor 2104 has a source thereof connected to the power supply voltage node, has a gate thereof connected to the drain of the p-channel field-effect transistor 2103, and has a drain thereof connected to an output terminal. An n-channel field-effect transistor 2109 has a drain thereof connected to the output terminal, has a gate thereof connected to the bias terminal, and has a source thereof connected to the reference potential node.

In the case where the power-down signal is low level, the p-channel field-effect transistor 2103 and the n-channel field-effect transistor 2108 are turned off and the operational amplifier operates normally.

In the case where the power-down signal is high level, the p-channel field-effect transistor 2103 and the n-channel field-effect transistor 2108 are turned on and the p-channel field-effect transistor 2104 and the n-channel field-effect transistor 2109 are turned off. The operational amplifier is brought into an off state, and power can be saved.

Figure 22:
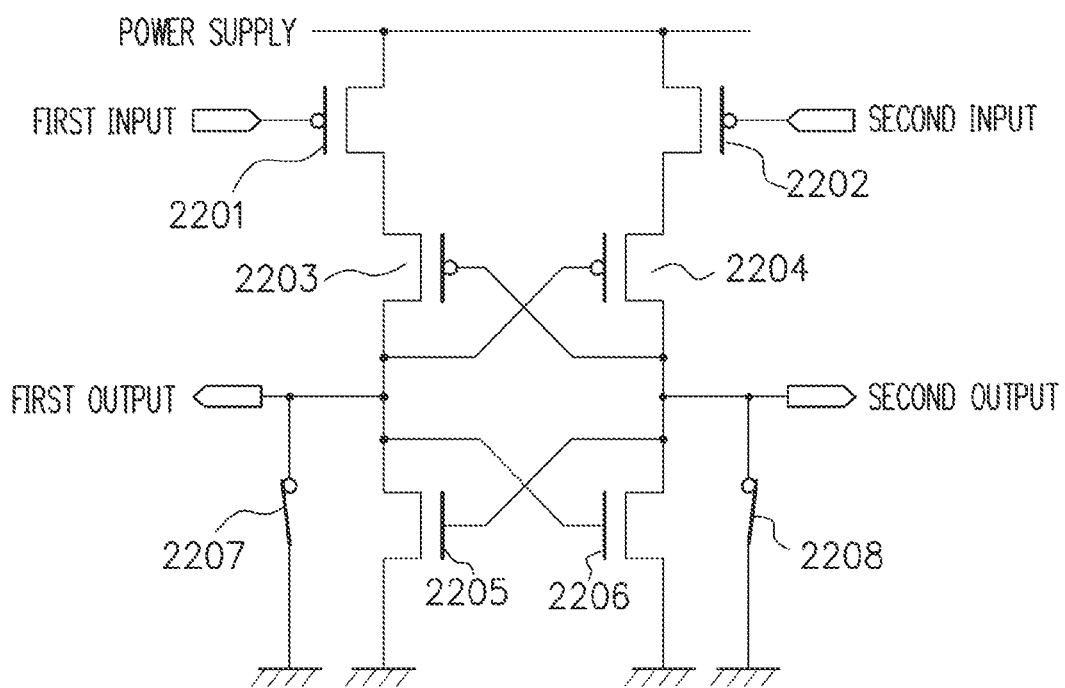
FIG. 22 is a diagram illustrating a reset mode of a comparator.
Figure 23:
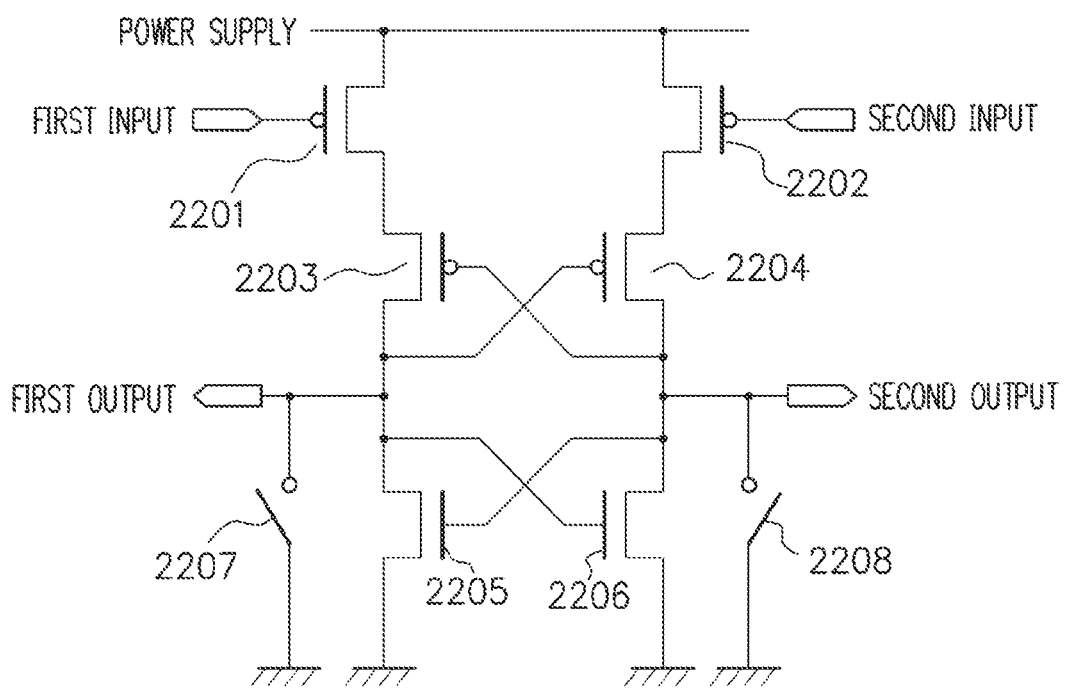
FIG. 23 is a diagram illustrating a comparison mode of the comparator.

FIG. 22 is a diagram illustrating a reset mode of the above-described comparator, and FIG. 23 is a diagram illustrating a comparison mode of the above-described comparator. The comparator repeats the reset mode in FIG. 22 and the comparison mode alternately.

A p-channel field-effect transistor 2201 has a source thereof connected to the power supply potential node, has a gate thereof connected to a first input terminal, and has a drain thereof connected to a source of a p-channel field-effect transistor 2203. A p-channel field-effect transistor 2202 has a source thereof connected to the power supply potential node, has a gate thereof connected to a second input terminal, and has a drain thereof connected to a source of a p-channel field-effect transistor 2204.

The p-channel field-effect transistor 2203 has a gate thereof connected to a second output terminal and has a drain thereof connected to a first output terminal. The p-channel field-effect transistor 2204 has a gate thereof connected to the first output terminal and has a drain thereof connected to the second output terminal.

An n-channel field-effect transistor 2205 has a drain thereof connected to the first output terminal, has a gate thereof connected to the second output terminal, and has a source thereof connected to the reference potential node. An n-channel field-effect transistor 2206 has a drain thereof connected to the second output terminal, has a gate thereof connected to the first output terminal, and has a source thereof connected to the reference potential node.

A switch 2207 is connected between the first output terminal and the reference potential node. At the reset mode in FIG. 22, the switch 2207 and a switch 2208 are turned on. At the comparison mode in FIG. 23, the switch 2207 and the switch 2208 are turned off.

The p-channel field-effect transistor 2203 and the n-channel field-effect transistor 2205 configure an inverter. The p-channel field-effect transistor 2204 and the n-channel field-effect transistor 2206 configure an inverter.

When the reset mode in FIG. 22 is changed to the comparison mode in FIG. 23, either the p-channel field-effect transistor 2201 or the p-channel field-effect transistor 2202 is turned on, depending on the magnitude relationship between the first input terminal and the second input terminal. The first output terminal and the second output terminal output comparison results.

FIG. 24 is a circuit diagram illustrating a configuration example of the above-described constant-current source. An operational amplifier 2401 has a +input terminal thereof connected to a reference voltage input node, has a −input terminal thereof connected to a source of an n-channel field-effect transistor 2404, and has an output terminal thereof connected to a gate of the n-channel field-effect transistor 2404. The reference voltage input node is connected to a bandgap circuit or an external stabilized power supply.

A p-channel field-effect transistor 2402 has a source thereof connected to the power supply voltage node and has a gate thereof and a drain thereof connected to a drain of the n-channel field-effect transistor 2404. A resistor 2405 is connected between the source of the n-channel field-effect transistor 2404 and the power supply potential node. The source of the n-channel field-effect transistor 2404 is always maintained at the same voltage as the reference voltage input node by the operational amplifier 2401. This allows a constant current to flow through the resistor 2405.

A p-channel field-effect transistor 2403 has a source thereof connected to the power supply voltage node, has a gate thereof connected to the gate of the p-channel field-effect transistor 2402, and has a drain thereof connected to a constant-current output node. The p-channel field-effect transistors 2402 and 2403 configure a current mirror circuit. By adjusting the size of the p-channel field-effect transistors 2402 and 2403, a mirror ratio can be varied to vary a constant current value.

FIG. 25 is a circuit diagram illustrating a configuration example of the above-described inverter. A p-channel field-effect transistor 2501 has a source thereof connected to the power supply voltage node, has a gate thereof connected to an input terminal, and has a drain thereof connected to an output terminal. An n-channel field-effect transistor 2502 has a drain thereof connected to the output terminal, has a gate thereof connected to the input terminal, and has a source thereof connected to the reference potential node.

Figure 26:
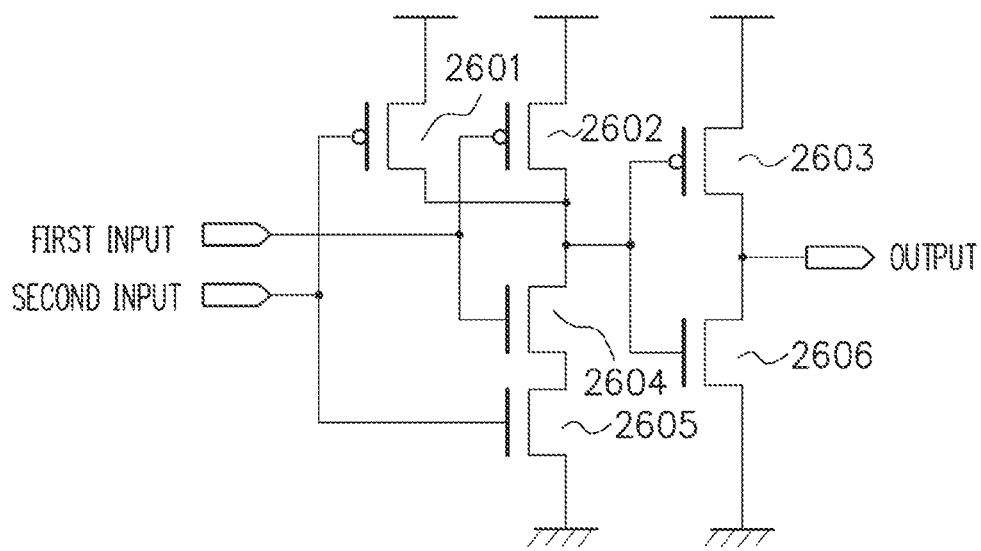
FIG. 26 is a circuit diagram illustrating a configuration example of a logical product circuit.

FIG. 26 is a circuit diagram illustrating a configuration example of the above-described logical product circuit. A p-channel field-effect transistor 2601 has a source thereof connected to the power supply voltage node, has a gate thereof connected to a second input terminal, and has a drain thereof connected to a drain of an n-channel field-effect transistor 2604. A p-channel field-effect transistor 2602 has a source thereof connected to the power supply voltage node, has a gate thereof connected to a first input terminal, and has a drain thereof connected to the drain of the n-channel field-effect transistor 2604.

The n-channel field-effect transistor 2604 has a gate thereof connected to the first input terminal and has a source thereof connected to a drain of an n-channel field-effect transistor 2605. The n-channel field-effect transistor 2605 has a gate thereof connected to the second input terminal and has a source thereof connected to the reference potential node.

A p-channel field-effect transistor 2603 has a source thereof connected to the power supply voltage node, has a gate thereof connected to the drain of the n-channel field-effect transistor 2604, and has a source thereof connected to an output terminal. An n-channel field-effect transistor 2606 has a drain thereof connected to the output terminal, has a gate thereof connected to the drain of the n-channel field-effect transistor 2604, and has a source thereof connected to the reference potential node.

Figure 27:
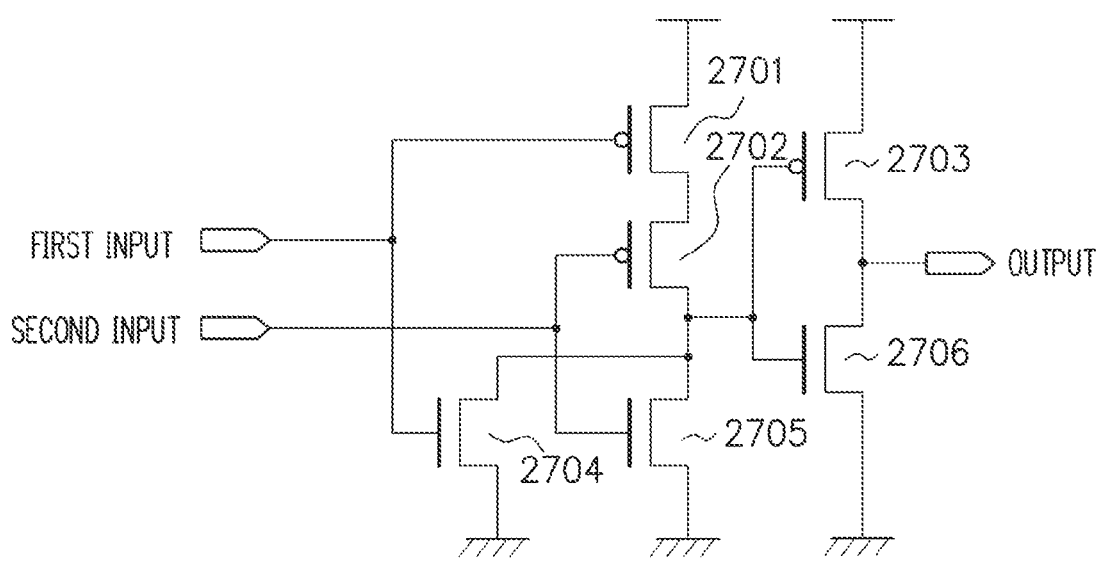
FIG. 27 is a circuit diagram illustrating a configuration example of a logical sum circuit.

FIG. 27 is a circuit diagram illustrating a configuration example of the above-described logical sum circuit. A p-channel field-effect transistor 2701 has a source thereof connected to the power supply voltage rode, has a gate thereof connected to a first input terminal, and has a drain thereof connected to a source of a p-channel field-effect transistor 2702. The p-channel field-effect transistor 2702 has a gate thereof connected to a second input terminal and has a drain thereof connected to a drain of an n-channel field-effect transistor 2705.

An n-channel field-effect transistor 2704 has a drain thereof connected to the drain of the n-channel field-effect transistor 2705, has a gate thereof connected to the first input terminal, and has a source thereof connected to the reference potential node. The n-channel field-effect transistor 2705 has a gate thereof connected to the second input terminal and has a source thereof connected to the reference potential node.

A p-channel field-effect transistor 2703 has a source thereof connected to the power supply voltage node, has a gate thereof connected to the drain of the n-channel field-effect transistor 2705, and has a drain thereof connected to the output terminal. An n-channel field-effect transistor 2706 has a drain thereof connected to the output terminal, has a gate thereof connected to the drain of the n-channel field-effect transistor 2705, and has a source thereof connected to the reference potential node.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

It is possible to shorten a dead time during which it is impossible to output an appropriate hold voltage in a reset period.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

Regarding the above descriptions of embodiments, we disclose the following additional statements.

1. A voltage hold circuit configured to operate every processing cycle, the processing cycle including a hold period and a reset period following the hold period, and hold a voltage value for an input voltage signal, the voltage hold circuit including:
   a first hold circuit configured to operate to hold a minimum voltage value for the input voltage signal in the hold period every the processing cycle; and
   a second hold circuit configured to operate to hold a maximum voltage value for the input voltage signal in the reset period every the processing cycle.

2. The voltage hold circuit according to statement 1, wherein
   the first hold circuit includes a first switch configured to connect a capacitor to a reference potential node having a lower potential than a power supply voltage node in the case where a voltage value of the input voltage signal is smaller than a voltage value held in the capacitor, and
   the second hold circuit includes a second switch configured to connect the capacitor to the power supply voltage node in the case where a voltage value of the input voltage signal is larger than a voltage value held in the capacitor.

3. The voltage hold circuit according to statement 2, wherein
a reset signal indicating the hold period or the reset period is input,
the first switch is brought into a state of being able to be turned on when the reset signal indicates the hold period, and the first switch is turned off when the reset signal indicates the reset period, and
the second switch is brought into a state of being able to be turned on when the reset signal indicates the reset period, and the second switch is turned off when the reset signal indicates the hold period.

4. The voltage hold circuit according to statement 1, wherein
the first hold circuit includes a third switch configured to connect a capacitor to a first current source whose current direction is a first direction in the case where a voltage value of the input voltage signal is smaller than a voltage value held in the capacitor, and
the second hold circuit comprises a fourth switch configured to connect the capacitor to a second current source whose current direction is a second direction reverse to the first direction in the case where a voltage value of the input voltage signal is larger than a voltage value held in the capacitor.

5. The voltage hold circuit according to statement 4, wherein
the first and second current sources are configured by a bidirectional current source whose current direction is reversed between the hold period and the reset period.

6. The voltage hold circuit according to statement 5, wherein
a reset signal indicating the hold period or the reset period is input, and
the bidirectional current source changes the current direction according to the reset signal.

7. A voltage hold circuit configured to operate every processing cycle, the processing cycle including a hold period and a reset period following the hold period, and hold a voltage value for an input voltage signal, the voltage hold circuit including:
a generation circuit configured to generate a reset voltage signal which varies according to the input voltage signal;
a hold circuit configured to operate to hold a minimum voltage value for the input voltage signal in the hold period every the processing cycle; and
a reset circuit configured to reset an output voltage based on the reset voltage signal in the reset period every the processing cycle.

8. The voltage hold circuit according to statement 7, wherein
the hold circuit includes a switch configured to connect the capacitor to a reference potential node in the case where a voltage value of the input voltage signal is smaller than a voltage value held in the capacitor.

9. The voltage hold circuit according to statement 7, wherein
the generation circuit is configured to generate the reset voltage signal so that the reset voltage signal has a voltage value that differs from the voltage value of the input voltage signal by a first value.

10. A voltage hold circuit configured to hold a voltage value for an input voltage signal, the voltage hold circuit comprising:
a determination circuit configured to determine an increase or a decrease in the input voltage signal;
a first hold circuit configured to operate to hold a minimum voltage value for the input voltage signal every first period, the determination circuit determining an increase in the input voltage signal in the first period; and
a second hold circuit configured to operate to hold a maximum voltage value for the input voltage signal every second period, the determination circuit determining a decrease in the input voltage signal in the second period.

11. The voltage hold circuit according to statement 10, wherein
the first hold circuit includes a first switch configured to connect a capacitor to a reference potential node in the case where a voltage value of the input voltage signal is smaller than a voltage value held in the capacitor in the first period, and
the second hold circuit comprises a second switch configured to connect the capacitor to a power supply voltage node in the case where a voltage value of the input voltage signal is larger than a voltage value held in the capacitor in the second period.

12. A voltage hold circuit configured to operate every processing cycle, the processing cycle including a hold period and a reset period following the hold period, and hold a voltage value for an input voltage signal, the voltage hold circuit including:
a first hold circuit configured to operate to hold a maximum voltage value for the input voltage signal in the hold period every the processing cycle; and
a second hold circuit configured to operate to hold a minimum voltage value for the input voltage signal in the reset period every the processing cycle.

13. A voltage hold circuit configured to operate every processing cycle, the processing cycle including a hold period and a reset period following the hold period, and hold a voltage value for an input voltage signal, the voltage hold circuit including:
a generation circuit configured to generate a reset voltage signal which varies according to the input voltage signal;
a hold circuit configured to operate to hold a maximum voltage value for the input voltage signal in the hold period every the processing cycle; and
a reset circuit configured to reset an output voltage based on the reset voltage signal in the reset period every the processing cycle.

14. A voltage monitoring circuit, comprising:
the voltage hold circuit according to statement 1; and
an analog/digital converter configured to convert a voltage value held in the voltage hold circuit from an analog value to a digital value.

15. A voltage monitoring circuit, comprising:
the voltage hold circuit according to statement 7; and
an analog/digital converter configured to convert a voltage value held in the voltage hold circuit from an analog value to a digital value.

16. A voltage monitoring circuit, comprising;
the voltage hold circuit according to statement 10; and
an analog/digital converter configured to convert a voltage value held in the voltage hold circuit from an analog value to a digital value.

17. A voltage monitoring circuit, comprising:
the voltage hold circuit according to statement 12; and
an analog/digital converter configured to convert a voltage value held in the voltage hold circuit from an analog value to a digital value.

18. A voltage monitoring circuit, comprising:
the voltage hold circuit according to statement 13; and
an analog/digital converter configured to convert a voltage value held in the voltage hold circuit from an analog value to a digital value.

19. The voltage monitoring circuit according to any one of statement 14-18, further comprising:
a plurality of the voltage hold circuits; and
a switching circuit provided between the plurality of the voltage hold circuits and the analog/digital converter, wherein
the switching circuit is configured to output voltage values held in the plurality of the voltage hold circuits to the analog/digital converter in a time division manner.

20. A semiconductor integrated circuit, comprising:
an internal circuit configured to perform processing based on an input voltage signal;
the voltage hold circuit according to statement 1; and
an analog/digital converter configured to convert a voltage value held in the voltage hold circuit from an analog value to a digital value.

21. A semiconductor integrated circuit, comprising:
an internal circuit configured to perform processing based on an input voltage signal;
the voltage hold circuit according to statement 7; and
an analog/digital converter configured to convert a voltage value held in the voltage hold circuit from an analog value to a digital value.

22. A semiconductor integrated circuit, comprising:
an internal circuit configured to perform processing based on an input voltage signal;
the voltage hold circuit according to statement 10; and
an analog/digital converter configured to convert a voltage value held in the voltage hold circuit from an analog value to a digital value.

23. A semiconductor integrated circuit, comprising:
an internal circuit configured to perform processing based on an input voltage signal;
the voltage hold circuit according to statement 12; and
an analog/digital converter configured to convert a voltage value held in the voltage hold circuit from an analog value to a digital value.

24. A semiconductor integrated circuit, comprising:
an internal circuit configured to perform processing based on an input voltage signal;
the voltage hold circuit according to statement 13; and
an analog/digital converter configured to convert a voltage value held in the voltage hold circuit from an analog value to a digital value.

25. The semiconductor integrated circuit according to statement 20-24, wherein
the input voltage signal is a power supply voltage of a power supply voltage node of the internal circuit, the semiconductor integrated circuit further comprising:
a logic circuit configured to receive a digital voltage value output by the analog/digital converter and output a control signal for controlling the power supply voltage.

26. The semiconductor integrated circuit according to claim 25, further comprising:
a power supply circuit configured to control the power supply voltage supplied to the power supply voltage node of the internal circuit based on the control signal.

27. The semiconductor integrated circuit according to claim 25, further comprising:
a safety mechanism block configured to detect an abnormality in the power supply voltage to be supplied to the power supply voltage node of the internal circuit and output a reset signal or an alarm signal based on the control signal.

28. The semiconductor integrated circuit according to statement 20-24, wherein
the input voltage signal is an output signal of a signal source, the semiconductor integrated circuit further comprising:
a logic circuit configured to receive a digital voltage value output by the analog/digital converter and output a control signal for controlling signal processing; and
a signal processing block configured to perform signal processing based on the control signal.

What is claimed is:
1. A voltage hold circuit configured to operate every processing cycle, the processing cycle including a hold period and a reset period following the hold period, and hold a voltage value for an input voltage signal, the voltage hold circuit comprising:
a first hold circuit configured to operate to hold a minimum voltage value for the input voltage signal in the hold period every processing cycle, by using a first capacitor and a first comparator to compare the input voltage signal with a minimum voltage held in the first capacitor; and
a second hold circuit configured to operate to hold a maximum voltage value for the input voltage signal in the reset period every processing cycle, by using a second capacitor and a second comparator to compare the input voltage signal with a maximum voltage held in the second capacitor.

2. The voltage hold circuit according to claim 1, wherein
the first hold circuit includes a first switch configured to connect a capacitor to a reference potential node having a lower potential than a power supply voltage node in a case where a voltage value of the input voltage signal is smaller than a voltage value held in the capacitor, and
the second hold circuit includes a second switch configured to connect the capacitor to the power supply voltage node in a case where a voltage value of the input voltage signal is larger than a voltage value held in the capacitor.

3. The voltage hold circuit according to claim 2, wherein
a reset signal indicating the hold period or the reset period is input,
the first switch is brought into a state of being able to be turned on when the reset signal indicates the hold period, and the first switch is turned off when the reset signal indicates the reset period, and
the second switch is brought into a state of being able to be turned on when the reset signal indicates the reset period, and the second switch is turned off when the reset signal indicates the hold period.

4. The voltage hold circuit according to claim 1, wherein
the first hold circuit includes a third switch configured to connect a capacitor to a first current source whose current direction is a first direction in a case where a voltage value of the input voltage signal is smaller than a voltage value held in a capacitor, and the second hold circuit includes a fourth switch configured to connect the capacitor to a second current source whose current direction is a second direction reverse to the first direction in a case where a voltage value of the input voltage signal is larger than a voltage value held in the capacitor.

5. The voltage hold circuit according to claim 4, wherein the first and second current sources are configured by a bidirectional current source whose current direction is reversed between the hold period and the reset period.

6. A voltage monitoring circuit, comprising:
the voltage hold circuit according to claim 1; and
an analog/digital converter configured to convert a voltage value held in the voltage hold circuit from an analog value to a digital value.

7. A semiconductor integrated circuit, comprising:
an internal circuit configured to perform processing based on an input voltage signal;
the voltage hold circuit according to claim 1; and
an analog/digital converter configured to convert a voltage value held in the voltage hold circuit from an analog value to a digital value.

8. The semiconductor integrated circuit according to claim 7, wherein
the input voltage signal is a power supply voltage of a power supply voltage node of the internal circuit, the semiconductor integrated circuit further comprising:
a logic circuit configured to receive a digital voltage value output by the analog/digital converter and output a control signal for controlling the power supply voltage.

9. The semiconductor integrated circuit according to claim 8, further comprising:
a power supply circuit configured to control the power supply voltage supplied to the power supply voltage node of the internal circuit based on the control signal.

10. A voltage hold circuit configured to operate every processing cycle, the processing cycle including a hold period and a reset period following the hold period, and hold a voltage value for an input voltage signal, the voltage hold circuit comprising:
a generation circuit configured to generate a reset voltage signal which varies according to the input voltage signal, by using an operational amplifier;
a hold circuit configured to operate to hold a minimum voltage value for the input voltage signal in the hold period every processing cycle, by using a capacitor and a comparator to compare the input voltage signal with a minimum voltage held in the capacitor; and
a reset circuit configured to reset an output voltage based on the reset voltage signal in the reset period every processing cycle.

11. The voltage hold circuit according to claim 10, wherein
the hold circuit includes a switch configured to connect a capacitor to a reference potential node in a case where a voltage value of the input voltage signal is smaller than a voltage value held in the capacitor.

12. A voltage monitoring circuit, comprising:
the voltage hold circuit according to claim 10; and
an analog/digital converter configured to convert a voltage value held in the voltage hold circuit from an analog value to a digital value.

13. A semiconductor integrated circuit, comprising:
an internal circuit configured to perform processing based on an input voltage signal;
the voltage hold circuit according to claim 10; and
an analog/digital converter configured to convert a voltage value held in the voltage hold circuit from an analog value to a digital value.

14. The semiconductor integrated circuit according to claim 13, wherein
the input voltage signal is a power supply voltage of a power supply voltage node of the internal circuit, the semiconductor integrated circuit further comprising:
a logic circuit configured to receive a digital voltage value output by the analog/digital converter and output a control signal for controlling the power supply voltage.

15. The semiconductor integrated circuit according to claim 14, further comprising:
a power supply circuit configured to control the power supply voltage supplied to the power supply voltage node of the internal circuit based on the control signal.

16. A voltage hold circuit configured to hold a voltage value for an input voltage signal, the voltage hold circuit comprising:
a determination circuit configured to determine an increase or a decrease in the input voltage signal, by using a differential circuit to input the input voltage signal;
a first hold circuit configured to operate to hold a minimum voltage value for the input voltage signal every first period, by using a first capacitor and a first comparator to compare the input voltage signal with a minimum voltage held in the first capacitor, the determination circuit determining an increase in the input voltage signal in the first period; and
a second hold circuit configured to operate to hold a maximum voltage value for the input voltage signal every second period, by using a second capacitor and a second comparator to compare the input voltage signal with a maximum voltage held in the second capacitor, the determination circuit determining a decrease in the input voltage signal in the second period.

17. The voltage hold circuit according to claim 16, wherein
the first hold circuit includes a first switch configured to connect a capacitor to a reference potential node in a case where a voltage value of the input voltage signal is smaller than a voltage value held in the capacitor in the first period, and
the second hold circuit includes a second switch configured to connect the capacitor to a power supply voltage node in the case where a voltage value of the input voltage signal is larger than a voltage value held in the capacitor in the second period.

18. A voltage monitoring circuit, comprising;
the voltage hold circuit according to claim 16; and
an analog/digital converter configured to convert a voltage value held in the voltage hold circuit from an analog value to a digital value.

19. A semiconductor integrated circuit, comprising:
an internal circuit configured to perform processing based on an input voltage signal;
the voltage hold circuit according to claim 16; and
an analog/digital converter configured to convert a voltage value held in the voltage hold circuit from an analog value to a digital value.

20. The semiconductor integrated circuit according to claim 19, wherein
the input voltage signal is a power supply voltage of a power supply voltage node of the internal circuit, the semiconductor integrated circuit further comprising:

a logic circuit configured to receive a digital voltage value output by the analog/digital converter and output a control signal for controlling the power supply voltage.

21. The semiconductor integrated circuit according to claim 20, further comprising:
a power supply circuit configured to control the power supply voltage supplied to the power supply voltage node of the internal circuit based on the control signal.

* * * * *